(12) United States Patent
Shpaisman et al.

(10) Patent No.: US 11,006,528 B2
(45) Date of Patent: May 11, 2021

(54) METHODS OF ETCHING CONDUCTIVE FEATURES, AND RELATED DEVICES AND SYSTEMS

(71) Applicant: Kateeva, Inc., Newark, CA (US)

(72) Inventors: Nava Shpaisman, Kedumim (IL); Moshe Frenkel, Jerusalem (IL)

(73) Assignee: KATEEVA, INC., Newark, CA (US)

( * ) Notice: Subject to any disclaimer, the term of this patent is extended or adjusted under 35 U.S.C. 154(b) by 0 days.

(21) Appl. No.: 16/507,358

(22) Filed: Jul. 10, 2019

(65) Prior Publication Data

US 2019/0335589 A1 Oct. 31, 2019

Related U.S. Application Data

(63) Continuation of application No. 15/835,116, filed on Dec. 7, 2017, now Pat. No. 10,398,034.
(Continued)

(51) Int. Cl.
*H05K 3/00* (2006.01)
*H05K 3/06* (2006.01)
*H05K 3/28* (2006.01)

(52) U.S. Cl.
CPC ............ *H05K 3/061* (2013.01); *H05K 3/068* (2013.01); *H05K 3/282* (2013.01);
(Continued)

(58) Field of Classification Search
CPC ..... H05K 3/002; H05K 3/0062; H05K 3/0064
See application file for complete search history.

(56) References Cited

U.S. PATENT DOCUMENTS

| 4,015,706 A | 4/1977 | Goffredo et al. |
| 4,127,438 A | 11/1978 | Babcock et al. |

(Continued)

FOREIGN PATENT DOCUMENTS

| EP | 1125760 B1 | 5/2006 |
| JP | 2002245794 A | 8/2002 |

(Continued)

OTHER PUBLICATIONS

Notice of Allowance dated Mar. 31, 2020 to U.S. Appl. No. 15/578,300.
(Continued)

*Primary Examiner* — Jeremy C Norris
(74) *Attorney, Agent, or Firm* — Hauptman Ham, LLP

(57) ABSTRACT

A method of making a device patterned with one or more electrically conductive features includes depositing a conductive material layer over an electrically insulating surface of a substrate, depositing an anti-corrosive material layer over the conductive material layer, and depositing an etch-resist material layer over the anti-corrosive material layer. The etch-resist material layer may be deposited over the anti-corrosive material layer, and the anti-corrosive material layer forming a bi-component etch mask in a pattern resulting in covered portions of the conductive material layer and exposed portions of the conductive material layer, the covered portions being positioned at locations corresponding to one or more conductive features of the device. A wet-etch process is performed to remove the exposed portions of the conductive material layer from the electrically insulating substrate, and the bi-component etch mask is removed to expose the remaining conductive material. Systems and devices relate to devices with patterned features.

24 Claims, 16 Drawing Sheets

Related U.S. Application Data

(60) Provisional application No. 62/432,710, filed on Dec. 12, 2016.

(52) U.S. Cl.
CPC ........... *H05K 2203/0392* (2013.01); *H05K 2203/1163* (2013.01); *H05K 2203/1184* (2013.01)

(56) References Cited

U.S. PATENT DOCUMENTS

| | | | |
|---|---|---|---|
| 4,604,314 | A | 8/1986 | Gentzkow et al. |
| 4,756,994 | A | 7/1988 | Araki et al. |
| 5,055,374 | A | 10/1991 | Seio et al. |
| 5,376,503 | A | 12/1994 | Audett et al. |
| 6,066,197 | A | 5/2000 | Bristol et al. |
| 6,218,074 | B1 | 4/2001 | Dueber et al. |
| 6,222,136 | B1 | 4/2001 | Appelt et al. |
| 6,399,273 | B1 | 6/2002 | Yamada et al. |
| 6,579,660 | B1 | 6/2003 | Figov |
| 6,858,352 | B1 | 2/2005 | Band |
| 6,860,925 | B2 | 3/2005 | Soutar et al. |
| 7,147,765 | B2 | 12/2006 | Klocke et al. |
| 8,421,215 | B2 | 4/2013 | Tani et al. |
| 10,398,034 | B2 | 8/2019 | Shpaisman et al. |
| 2003/0164466 | A1 | 9/2003 | Hauf et al. |
| 2004/0023120 | A1 | 2/2004 | Nishikubo et al. |
| 2004/0245213 | A1* | 12/2004 | Fukase ................ H05K 3/064 216/14 |
| 2006/0020788 | A1 | 1/2006 | Han et al. |
| 2006/0049129 | A1 | 3/2006 | Hopper et al. |
| 2006/0060563 | A1 | 3/2006 | Kim et al. |
| 2006/0199394 | A1 | 9/2006 | Takahashi et al. |
| 2008/0245768 | A1 | 10/2008 | Cottrell et al. |
| 2008/0308003 | A1 | 12/2008 | Krol et al. |
| 2009/0163615 | A1 | 6/2009 | Halahmi et al. |
| 2009/0278904 | A1 | 11/2009 | Oh et al. |
| 2012/0045583 | A1 | 2/2012 | Frenkel et al. |
| 2012/0288683 | A1 | 11/2012 | Kuo et al. |
| 2013/0298398 | A1 | 11/2013 | Miyasaka et al. |
| 2013/0334036 | A1 | 12/2013 | Keigler et al. |
| 2014/0106278 | A1* | 4/2014 | Cho ..................... G03F 7/11 430/283.1 |
| 2014/0141169 | A1 | 5/2014 | Huelsmann et al. |
| 2014/0290520 | A1 | 10/2014 | Frenkel et al. |
| 2014/0363632 | A1 | 12/2014 | Smet et al. |
| 2015/0267305 | A1 | 9/2015 | Choi et al. |
| 2016/0079193 | A1* | 3/2016 | Arvin .................. H01L 24/11 438/614 |
| 2017/0264066 | A1 | 9/2017 | Oki et al. |
| 2018/0146556 | A1 | 5/2018 | Frenkel et al. |
| 2018/0192521 | A1 | 7/2018 | Shpaisman et al. |
| 2018/0242457 | A1 | 8/2018 | Shpaisman et al. |
| 2019/0335589 | A1 | 10/2019 | Shpaisman et al. |

FOREIGN PATENT DOCUMENTS

| | | |
|---|---|---|
| JP | 2009272609 A | 11/2009 |
| WO | 2003081966 A2 | 10/2003 |
| WO | 2009116401 A1 | 9/2009 |
| WO | 2016185215 A1 | 11/2016 |
| WO | 2016193978 A2 | 12/2016 |
| WO | 2016193978 A3 | 1/2017 |
| WO | 2017025949 A1 | 2/2017 |

OTHER PUBLICATIONS

Extended EP Search dated Feb. 27, 2019, to EP Patent Application No. 16834759.9.
Extended EP Search Report dated Jan. 3, 2019, to EP Patent Application 16802692.0.
Final Office action dated Feb. 11, 2019 for U.S. Appl. No. 15/751,866.
International Search Report and Written Opinion dated Apr. 9, 2018 to PCT Application No. PCT/IL2017/051338.
International Search Report and Written Opinion dated Jan. 6, 2017, to PCT Application No. PCT/IL2016/050820.
International Search Report and Written Opinion dated Nov. 17, 2016, to PCT Application No. PCT/IL2016/050567.
Non Final Office Action dated Oct. 21, 2019 for U.S. Appl. No. 15/578,300.
Non Final Office Action dated Oct. 9, 2019 for U.S. Appl. No. 15/751,866.
Non-Final Office action dated Sep. 28, 2018 for U.S. Appl. No. 15/751,866.
Notice of Allowance dated Feb. 25, 2020 for U.S. Appl. No. 15/751,866.
Quan et al. "Adsorption Behaviour of Schiff Base and Corrosion Protection of Resulting Films to Copper Substrate," Corrosion Science, vol. 44, pp. 703-715, Jun. 6, 2000.
CN Office Action dated Jul. 2, 2020 to CN Patent Application No. 201680038043.6.
JP Office action dated Jun. 5, 2020 to JP Patent Application No. 2018-515364.
Non Final Office Action dated Jul. 20, 2020 to U.S. Appl. No. 16/507,358.
Notice of Allowance dated Jun. 2, 2020 to U.S. Appl. No. 15/751,866.
Extended EP Search Report dated Aug. 4, 2020 in EP Patent Application No. 17880261.7.

* cited by examiner

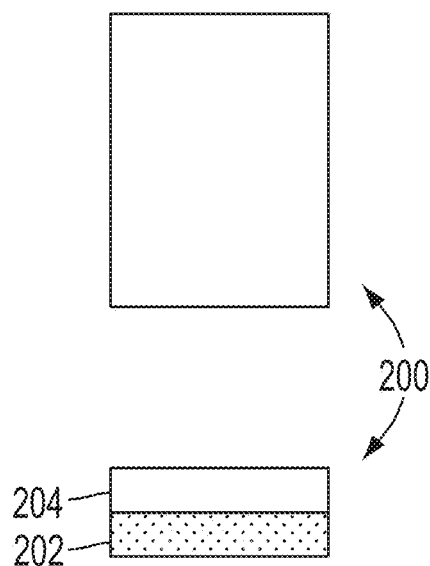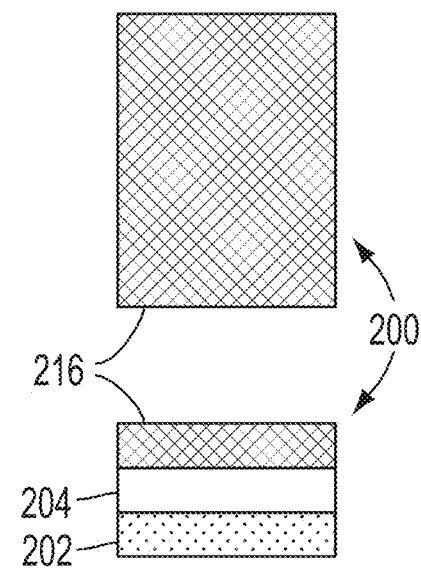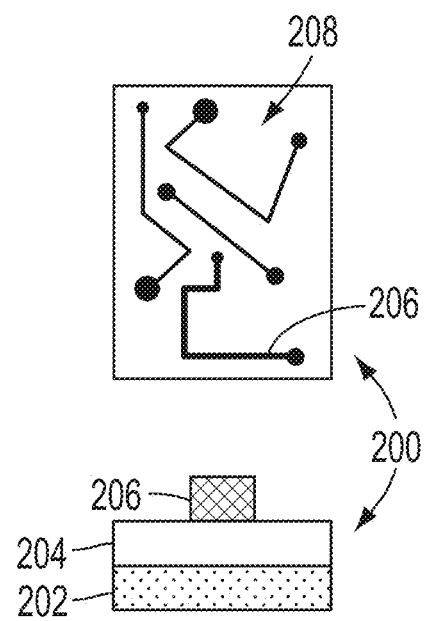
FIG. 2A
FIG. 2B
FIG. 2C

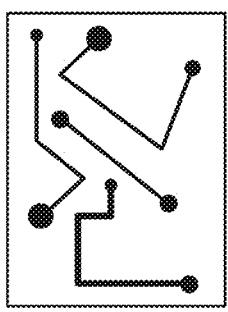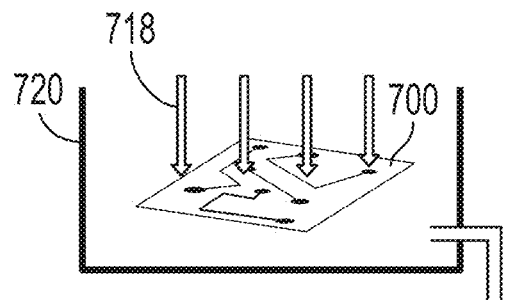
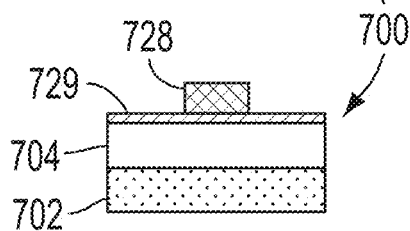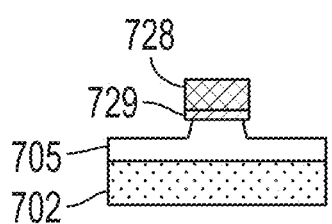
FIG. 7A  FIG. 7B
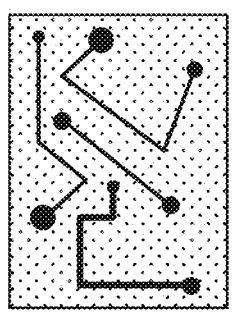
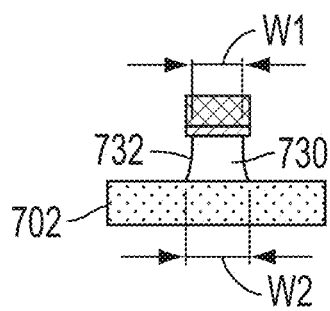
FIG. 7C

METHODS OF ETCHING CONDUCTIVE FEATURES, AND RELATED DEVICES AND SYSTEMS

CROSS REFERENCE TO RELATED APPLICATIONS

This application is a continuation of U.S. Utility patent application Ser. No. 15/835,116, filed on Dec. 7, 2017, which in turns claims priority to and the benefit of U.S. Provisional Application No. 62/432,710, entitled "METHOD OF ETCHING CONDUCTIVE LINES," filed on Dec. 12, 2016, which is incorporated by reference herein in its entirety.

INTRODUCTION

Manufacturing of a variety of electronic devices and electronic components requires the fabrication of patterned layers on a substrate. For example, microchips, printed circuit boards, solar cells, electronic displays (such as liquid crystal displays, organic light emitting diode displays, and quantum dot electroluminescent displays), and a variety of other electrical or optical devices and components, may be comprised of multiple overlapping patterned layers of different materials supported by a substrate. Manufacturing one such patterned layer on a substrate may be carried out by applying an unpatterned layer of material onto the substrate, preparing on such layer an etch resist mask, and performing an etching process to remove the portions of the layer that are not covered by the etch resist mask, thus forming the patterned layer on the substrate.

In one illustrative example, which can be used for manufacturing of, for example, printed circuit boards (PCB's) or other electronic components, an electrically conductive metal layer is applied to an electrically insulating surface of a substrate (or equivalently, an electrically conductive layer is formed on an electrically insulating surface of a substrate), an etch resist mask is applied to (or formed on) the conductive layer, and an etching process is performed to remove portions of the conductive layer that are not covered by the etch resist mask, thus forming a patterned conductive layer on the electrically insulating surface of the substrate. The patterned conductive layer so formed may comprise one or more conductive features further comprising, for example, lines, circles, squares, and other shapes, of conductive material on the electrically insulating surface of the substrate. In certain cases, the etch process used to form such a patterned conductive layer may be a wet etch process, whereby a liquid etch material interacts with the conductive layer so as to remove the conductive layer from the electrically insulating surface of the substrate. Such a wet etch process may be a wet "chemical" etch process, for example.

A frequent characteristic of wet etching is "undercutting", which, in the representative example of etching a conductive layer, refers to the phenomenon of removal of conductive layer material under the etch mask. Such undercutting may decrease the conductivity of the conductive layer by reducing the feature width in the direction perpendicular to the flow of electrical current relative to the corresponding width of the etch mask. As a result, the conductivity may fall below a desired level. Such a reduction in conductivity due to undercutting may be especially pronounced in the case of relatively small feature widths, for example, feature widths below about 60 µm. This undercutting phenomenon may also impart to the conductive features sloped or non-planar "side-walls." As used herein, "side-walls" refers to lateral surfaces of a feature, such as the walls on the sides of the features which extend down from the top of the feature adjacent to the etch mask to the bottom of the feature adjacent to the substrate. In some cases, a feature associated with such undercutting may have sloped or non-planar side-walls such that a width near the top of the feature (near to the etch mask) is smaller than a width at the bottom of the feature (near to the substrate). As a certain minimum feature width at the top of the feature may be desired, for example, to achieve a desired conductivity or to achieve a desired electrical frequency response, such undercutting may impose lower limits on at least one of the minimum feature width or the minimum feature-to-feature spacing, thereby limiting the density of features that can be provided on the substrate.

Undercutting may be undesirable for applications other than the patterning of conductive metal lines in the manufacture of PCBs. For example, similar considerations as described above for PCB's may also apply to other applications utilizing metal lines for the purpose of carrying electrical current and/or electrical signals, for example, in the manufacture of microchips, electronic displays, or solar cells. In another example, other considerations may apply to applications utilizing a patterned layer a non-metal, for example, an optical coating or an insulating layer, in the manufacture of an electronic or optical device or component, where substantially vertical side-walls are desirable.

A need exists for improved techniques that mitigate (e.g., reduce or eliminate) undercutting on features formed using a wet etch process when forming patterned layers on a substrate for the purpose of manufacturing electronic and/or optical devices or electronic and/or optical components.

In conventional processing, the etch mask described above is formed by applying to the substrate a blanket coating of a photo-sensitive material (often a UV light sensitive material) that upon pattern-wise light exposure and subsequent processing is converted into the etch mask. Such subsequent processing typically includes removal of the photo-sensitive material (e.g. during a developing step) so as to form the etch mask pattern on the substrate. In many instances, for example without limitation, when using an etch mask to pattern a metal layer of a PCB, the etch mask covers less than 50% of the substrate surface and the removed photo-sensitive material is discarded as waste. In many instances, the removal of the photo-sensitive material requires washing the substrate in a liquid (e.g. a developer) and the liquid used to perform such washing is discarded as waste. In many instances, for example without limitation, when using an etch mask to pattern a metal layer of a PCB, the photo-sensitive material is prepared on a carrier sheet and is then transferred from the carrier sheet onto the substrate via lamination, and after such transfer the carrier sheet is discarded as waste. When manufacturing electronic and/or optical devices and/or components, it is often desirable to reduce waste. One approach to reducing such waste is to directly apply the etch mask onto the substrate in the desired pattern using non-impact printing (e.g. inkjet printing) to deliver to the substrate a liquid etch mask ink in the desired pattern and then subsequently process the liquid coating (e.g. via drying and/or baking) to form the finished etch mask. However, the inks delivered by such non-impact printing methods typically are not well absorbed on the surface of a substrate used in the manufacture of an optical and/or electrical component and/device, and such inks may spread and/or translate on such a surface in an uncontrolled way, leading to such phenomena as clustering, coalescence, and dot gain. As a result, the etch mask resulting from such non-impact printing processes may exhibit reduced resolution, lack of details, inconsistent patterned line width, poor line edge smoothness, connections between features that are to be separated, and breaks in features that are to be continuous.

In such cases that non-impact printing is utilized to prepare an etch mask as described above, a need exists to mitigate (e.g. reduce or eliminate) such uncontrolled spreading and/or translation of the deposited liquid etch mask ink on the surface of the substrate.

SUMMARY

In one exemplary aspect of the disclosure, a method of making a device patterned with one or more electrically conductive features includes depositing a conductive material layer over an electrically insulating surface of a substrate, depositing an anti-corrosive material layer over the conductive material layer, and depositing an etch-resist material layer over the anti-corrosive material layer. The depositing an etch-resist material layer over the anti-corrosive material layer, the etch-resist material layer and the anti-corrosive material layer forming a bi-component etch mask in a pattern resulting in covered portions of the conductive material layer and exposed portions of the conductive material layer, the covered portions being positioned at locations corresponding to one or more conductive features of the device. A wet-etch process is performed to remove the exposed portions of the electrically insulating substrate, and the bi-component etch mask is removed to expose the remaining conductive material of the covered portions of the conductive material layer, thereby forming the one or more electrically conductive features of the device.

In another exemplary aspect of the disclosure, an apparatus for making a device patterned with electrically conductive features includes a first deposition module configured to deposit an anti-corrosive material layer over a conductive material layer over an electrically insulating surface of a substrate, a second deposition module configured to deposit an etch-resist material layer over the anti-corrosive material, and a wet etching module configured to etch the conductive material layer of the substrate.

In yet another exemplary aspect of the disclosure, a device patterned with electrically conductive features comprises a substrate having an electrically insulating surface and a conductive feature disposed on the electrically insulating surface. The conductive feature comprises a height (c) measured in a direction normal to the electrically insulating surface, a first width (a) measured at the electrically insulating surface, and a second width (b) measured at an end of the conductive feature opposite the electrically insulating surface along the height (c) of the conductive feature. A value of half a difference between the first width (a) and the second width (b) divided by the height (c) is at least 2 (i.e. $[a-b]/c \geq 2$).

In yet another exemplary aspect of the disclosure, a method includes applying a first liquid composition comprising a first reactive component onto a metallic surface to form a primer layer, and image-wise printing by a non-impact printing process on the primer layer a second liquid composition comprising a second reactive component to produce an etch mask according to a predetermined pattern. When droplets of the second liquid composition contact the primer layer, the second reactive component undergoes a chemical reaction with the first reactive component to immobilize the droplets.

Additional objects, features, and/or other advantages will be set forth in part in the description which follows, and in part will be obvious from the description, or may be learned by practice of the present disclosure and/or claims. At least some of these objects and advantages may be realized and attained by the elements and combinations particularly pointed out in the appended claims.

Both the foregoing general description and the following detailed description are exemplary and explanatory only and are not restrictive of the claims; rather the claims should be entitled to their full breadth of scope, including equivalents.

BRIEF DESCRIPTION OF THE DRAWINGS

FIGS. 2A-2C show cross-sectional and plan views of a device undergoing another conventional process for forming a patterned layer on a substrate.

FIGS. 7A-7C show cross-sectional and plan views of a device undergoing a process for forming a patterned layer on a substrate according to another exemplary embodiment of the present disclosure.

Figure 1A:
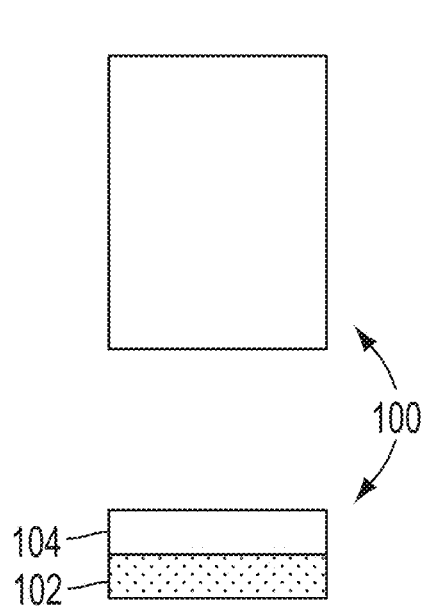
FIGS. 1A-1D show cross-sectional and plan views of a device undergoing a conventional process for forming a patterned layer on a substrate.

For simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the disclosure. However, it will be understood by those skilled in the art that the present disclosure may be practiced without these specific details. In other instances, well-known methods, procedures, and components have not been described in detail so as not to obscure the present disclosure.

Microchips, printed circuit boards, solar cells, electronic displays (such as, but not limited to, for example, liquid crystal displays, organic light emitting diode displays, and quantum dot electro-luminescent displays), and a variety of other electrical or optical devices and components, may be comprised of multiple overlapping layers, including patterned layers, of different materials supported by a substrate. Various exemplary embodiments of the disclosure contemplate methods and devices for forming a patterned layer on a substrate for application in the fabrication of electrical and/or optical devices and/or components. Herein a "device layer" shall refer to a layer of a material that, in its final form, which in some instances may be patterned, comprises a layer in a finished optical and/or electronic device and/or component, wherein further, a "patterned device layer" shall refer to such a layer after it has been patterned, and an "unpatterned device layer" shall refer to such a layer before it has been patterned. For example, various exemplary embodiments contemplate a patterned device layer of a conductive material that comprises a set of conductive lines, for example, as may be fabricated on a substrate as part of manufacturing a printed circuit board (PCB) or other electronic component. According to embodiments of the disclosure, an unpatterned device layer on a substrate, for example without limitation, a conductive layer of copper or other conductive material that overlies an electrically insulating surface of substrate, may be coated with a "primer" layer comprising an "undercut-reducing" material which has the effect of reducing undercutting during a wet etching process used to remove the device layer material exposed through an etch mask. For example, the undercut-reducing material may be an anti-corrosive material, which may comprise materials that exhibit anti-corrosive properties with respect to the material of the device layer. Such anti-corrosive materials may comprise polymers, organic materials, inorganic materials, Schiff bases, or other materials, such as those disclosed in International Patent Application Publication Nos. WO2016/193978 A2 and WO2016/025949 A1, the entire contents of each of which are incorporated by reference herein. The anti-corrosive material may be blanket-formed or -deposited, or pattern-formed or -deposited over the unpatterned device layer. In various exemplary embodiments, the terms anti-corrosive material and undercut-reducing material may be used interchangeably.

Various exemplary embodiments of the present disclosure contemplate forming a primer layer comprising an undercut-reducing material over an unpatterned device layer on a substrate and then forming on the substrate an etch mask by forming a patterned layer of an etch-resist material over the primer layer. Other exemplary embodiments of the present disclosure contemplate forming an etch mask over an unpatterned device layer on a substrate by forming on the substrate a patterned layer of a mixture of an undercut-reducing material and an etch-resist material over an unpatterned device layer without the need for forming a separate layer, for example a primer layer, comprising an undercut-reducing material. In exemplary embodiments, a primer layer containing an undercut-reducing material is formed over an unpatterned device layer on a substrate and then an etch mask is formed over the primer layer by applying to or depositing onto the primer layer a liquid etch-resist ink in a pattern and then converting the liquid ink into the etch mask via subsequent processing, for example, by drying or baking the ink to form a solid patterned layer of the etch-resist material, wherein such liquid etch-resist ink may comprise a material that interacts with the primer layer. For example, the liquid etch-resist ink may, upon contact with the primer layer, undergo a chemical reaction that constrains the translation or spread of the ink on the primer surface, e.g. via chemical reaction. In a further example, the liquid etch-resist ink may be applied to the surface in the form of droplets delivered by an inkjet nozzle, and upon contact with the primer surface, such droplets may be soon after effectively immobilized or "frozen" in place such that further translation or spreading of the ink droplet on the primer surface is greatly reduced or stopped entirely, as described in International Publication Nos. WO2016/193978 A2 and WO2016/025949 A1, the entire contents of each of which are incorporated by reference herein. In exemplary embodiments, constraining the spread of the etch-resist ink on the primer surface, for example via a chemical reaction resulting from the interaction between the etch-resist ink and the primer layer, may contribute to accurate deposition of mask patterns over the layer to be patterned.

In exemplary embodiments, a primer layer is formed over an unpatterned device layer on a substrate, and an etch mask is formed over the primer layer by delivering a liquid etch-resist ink onto the primer layer in a pattern and then converting the liquid ink into the etch mask via subsequent processing, for example, by drying or baking the ink to form a solid patterned layer resistant to subsequent etching. In exemplary embodiments, the primer layer comprises a first reactive component, the liquid etch-resist ink comprises a second reactive component, and when the etch-resist ink makes contact with the primer layer, the first and second reactive components react to effectively immobilize or "freeze" in place the ink so that further translation or spreading of the ink on the primer surface is greatly reduced or stopped entirely. In exemplary embodiments, the primer layer comprises a third reactive component, the liquid etch-resist ink comprises a fourth reactive component, and the reaction of the third and fourth reactive components produces an etch mask material that is relatively insoluble in the etch-resist ink and relatively insoluble in the etch solution used to subsequently etch the unpatterned device layer (wherein relatively insoluble is here defined with respect to the fourth reactive component). The etch mask material so formed is referred to herein as a bi-component material or a bi-component reaction product. In various embodiments, the reactive component that provides the majority of the mass to form bi-component material that makes up the etch mask is referred to as the etch-resist component, or equivalently, the etching-resisting component, while the other reactive component is referred to as the fixating component, or equivalently, the fixating reactive component or fixating composition. In exemplary embodiments, the etch-resist component comprises multiple materials. In exemplary embodiments, the fixating component comprises multiple materials. In exemplary embodiments, the etch-resist ink is an aqueous ink, and the bi-component material is relatively insoluble in water. In exemplary embodiments, the etch solution is an acidic etch solution, for example without limitation, a mixture of copper chloride and hydrogen peroxide. In exemplary embodiments, one or more of the first, second, third, or fourth components comprise multiple materials. In exemplary embodiments, the first and third components are the same. In exemplary embodiments, the second and fourth components are the same. In exemplary embodiments, the reaction that produces the bi-component material is the same as the reaction that immobilizes the droplets of the etch-resist ink on the primer layer. In exemplary embodiments, the primer layer comprises an undercut-preventing material. In exemplary embodiments, a reactive component of the primer (e.g. the first or third reactive component described above) comprises an undercut-preventing material. In exemplary embodiments, a reactive component of the etch-resist ink (e.g. the second or fourth reactive component described above) comprises an undercut-preventing material. In exemplary embodiments, the etch-resist ink comprises an undercut-preventing material.

In exemplary embodiments, at least one of the primer or the etch-resist ink may comprise multivalent and/or polycationic groups and/or multivalent inorganic cations. In exemplary embodiments, at least one of the primer or the etch-resist ink may comprise poly-anionic groups. In exemplary embodiments, at least one of the primer or the etch-resist ink may comprise reactive anionic components and be water soluble. In exemplary embodiments, such reactive anionic components may include at least one anionic polymer (in a base form) at pH higher than 7.0. In exemplary embodiments, such anionic polymer may be selected from acrylic resins and styrene-acrylic resins in their dissolved salt forms (for example without limitation, sodium salt form), sulphonic resins in their dissolved salt forms (for example without limitation, sodium salt form). In exemplary embodiments, such anionic polymer may be in an ammonium form or an amine neutralized form. In exemplary embodiments, such anionic polymer may be in the form of a polymer emulsion or dispersion. In various embodiments, the reaction that produces the bi-component material causes a large increase in the viscosity of the etch-resist ink on the primer layer, and the immobilization phenomenon results substantially from this increase in viscosity. In various embodiments, the etch-resist ink provides a majority of the material mass that forms the bi-component material. In various embodiments, the primer provides a majority of the material mass that forms the bi-component material, and in such cases, the primer layer may contain the etch resist component while the etch resist ink may contain the fixating component. In various embodiments, the primer layer is formed by providing a coating of a liquid primer ink over the unpatterned device layer and then subsequently processing the layer to form the primer layer, e.g. by drying or baking the layer. In various embodiments, such primer ink is aqueous. In various embodiments, the primer layer has good adhesion to the unpatterned device layer. In various embodiments, the primer layer is applied over the unpatterned device layer by inkjet printing, spray coating, metered rod coating, roll coating, dip coating, or any other suitable printing or coating method. In various embodiments, the primer layer may be a uniform (e.g. blanket) coating or may be a patterned coating.

In exemplary embodiments, the primer layer is formed at least in part by applying a surface activating solution over the unpatterned device layer. In exemplary embodiments, the surface activating solution comprises one or more of copper salts, ferric salts, chromic-sulfuric acids, persulfate salts, sodium chlorite, and hydrogen peroxide. In exemplary embodiments, the unpatterned device layer is a metal layer and the surface activating solution is applied onto the surface of the metal layer. In exemplary embodiments, the surface activating solution may be applied for a predetermined time and then washed off, for example without limitation, for 10 seconds, 20 seconds, 30 seconds, 60 seconds, or longer times. In exemplary embodiments, the surface activating solution may be applied by immersing the surface into a bath containing the surface activating solution. In exemplary embodiments, the surface activating solution may be applied by spraying the surface with the surface activating solution, or any other suitable method. In exemplary embodiments, the surface activating solution is washed off the surface using a washing fluid, for example without limitation, an alcohol solution, ethanol, propyl alcohol, iso-propyl alcohol, and acetone. In exemplary embodiments, wherein the surface is the surface of a copper layer, for example of a PCB, a surface activating aqueous solution of $CuCl_2$ (or any divalent copper salt) at a weight percent concentration of 0.5 to 1.0 is utilized, and the primer layer is formed at least in part by immersing the copper surface in a bath containing the surface activating solution for 30 seconds. In exemplary embodiments, wherein the surface is the surface of a copper layer, for example of a PCB, a surface activating aqueous solution of $Na_2S_2O_8$ (or any persulfate salt) at a weight percent concentration of 0.5 to 1.0 is utilized, and the primer layer is formed at least in part by immersing the copper surface in a bath containing the surface activating solution for 30 seconds. In exemplary embodiments, wherein the surface is the surface of a copper layer, for example of a PCB, a surface activating aqueous solution of $H_2O_2$ at a weight percent concentration of 10 is utilized, and the primer layer is formed at least in part by immersing the copper surface in a bath containing the surface activating solution for 30 seconds. In exemplary embodiments, wherein the surface is the surface of a copper layer, for example of a PCB, a surface activating aqueous solution of $FeCl_3$ at a weight percent concentration of 20 is utilized, and the primer layer is formed at least in part by immersing the copper surface in a bath containing the surface activating solution for 10 seconds. In exemplary embodiments, wherein the surface is the surface of a copper layer, for example of a PCB, a surface activating aqueous solution of $HCrO_4/H_2SO_4$ at a weight percent concentration of 5 is utilized, and the primer layer is formed at least in part by immersing the copper surface in a bath containing the surface activating solution for 30 seconds. In exemplary embodiments, wherein the surface is the surface of a copper layer, for example of a PCB, a surface activating aqueous solution of $NaClO_2$ at a weight percent concentration of 5 is utilized, and the primer layer is formed at least in part by immersing the copper surface in a bath containing the surface activating solution for 60 seconds.

In exemplary embodiments of printing an etch-resist ink onto a primer layer using an inkjet printer, the substrate may be at approximately "room" temperature, e.g. in the range of 20° C. to 30° C., or may be at elevated temperature, e.g. as high as 100° C. In exemplary embodiments, a bi-component etch mask may have a thickness of at least 0.01 um. In exemplary embodiments, a bi-component etch mask may have a thickness less than 12 um.

In exemplary embodiments of the disclosure, a primer layer is deposited onto a substrate and an etch mask ink is subsequently deposited onto the primer layer using inkjet printing and then baked to form an etch mask layer. Soon after contacting the primer layer, droplets of the etch mask ink interact with the primer layer so as to effectively immobilize or "freeze" the droplets of ink such that further spreading and/or translation is greatly reduced or eliminated, as a result of a chemical reaction between a first reactive component in the primer layer and a second reactive component in the etch mask ink. Furthermore, one or more components of the etch mask ink undergoes a reaction with one or more components of the primer layer to form a bi-component etch mask material that is relatively insoluble in the etch mask ink and relatively insoluble in the etch solution with which the etch mask will be used (wherein relatively insoluble is here defined with respect to the etch mask ink components that react to form the bi-component etch mask material.) For example, the etch mask ink may be aqueous and the etch mask material resulting from such reaction is insoluble in water, and, the etch solution may be an acidic etch solution and the etch mask material resulting from such reaction is insoluble in the acidic etch solution.

In exemplary embodiments, coating an unpatterned device layer, such as a copper layer, with an undercut-preventing material, such as an anti-corrosive material, may be applicable to any process that uses an etch mask to protect the device layer material from being wet-etched. Other metal layers instead of copper may be used in exemplary embodiments, including but not limited to, for example, aluminum, stainless steel, gold, and metallic alloys. Exemplary embodiments of the disclosure include introducing the undercut-reducing material in the form of a primer layer prior to applying a photo-resist layer to an unpatterned device layer, for example, via lamination, slot die coating, or spin coating, that is subsequently patterned via exposure to selected wavelengths of light, for example UV light, through a photomask, or via direct laser imaging.

Action of the undercut-reducing material during a chemical etch process may mitigate (e.g., reduce, eliminate) the occurrence of undercut of the device layer features resulting from the patterning process. Thus, after a chemical etch process is performed, device layer features with sidewalls that are more vertical and less sloped as compared to a device layer formed without an undercut-reducing material may be formed due to reduction or elimination of the undercutting. When applied to a patterned device layer comprising a conductive material having the function of carrying electrical current or electrical signals, various embodiments of the disclosure may enhance the overall performance of the so-formed electrical circuitry, improve the overall conductivity of the individual conductive features, enhance frequency response, and enable the manufacturing of a pattern with higher density and both thinner features and thinner spaces between features. Analogous benefits also may be derived in components using patterned device layers of non-metallic materials, such as optical or insulating patterned features.

It is believed that during conventional wet-etching processes, as a liquid etchant advances down (e.g., in a direction toward a substrate) through a thickness of a device layer material being etched in those areas not covered by an etch mask, the liquid etchant also advances laterally into the lateral surface (e.g. side wall) of those portions of the device layer material covered by an etch mask. As the etching depth increases, more of the side wall is exposed to lateral etching, such that the portions of the side wall closest to the etch mask are exposed to the liquid etchant for a longer period of time than the portions of the side wall closest to the substrate, and accordingly are subject to increased lateral etching, thus imparting to the sidewalls of the resulting patterned device layer features an undercut shape. In other words, the time the etchant reacts with the device layer material to remove the portions of the device layer material increases with the distance from the substrate. While not wishing to be bound by any particular theory, it is believed that in conventional wet-etching processes, whether carried out by immersion or by jetting or spraying the etchant, the additional reaction time between the etchant and portions of the device layer material further from the substrate results in an erosion (removal) of the device layer material laterally inward in regions of the device layer material directly under and proximate the etch mask features, despite that the intent of the etch mask is to prevent the removal of the device layer material in those areas. Further explanation and depictions of this phenomenon are provided below in connection with FIGS. 4B-5C.

As discussed in various exemplary embodiments in accordance with the present disclosure, reaction between the etchant and portions of the device layer material corresponding to lateral surfaces, or equivalently, side walls, of a patterned device layer feature is mitigated (e.g., reduced, prevented, inhibited) during a wet etch process, thereby mitigating the formation of an undercut shape on the lateral surfaces.

FIGS. 1A-5C all illustrate various stages of processing a device to form a patterned device layer on a substrate, or equivalently, patterned device layer features on a substrate, according to various conventional processes. In an exemplary embodiment, the device is a PCB in the process of being manufactured and the device layer material is an electrically conductive material. However, those having ordinary skill in the art will appreciate reference to a PCB is non-limiting and exemplary only and that a variety of applications are encompassed within the scope of the present disclosure, such as various electronic and optical components referenced above. Referring now to FIGS. 1A-1D, various views of a device 100 undergoing processing to form patterned device layer features according to one conventional process is shown. FIG. 1A is a plan view and side view of a device 100 comprising a substrate 102 with an unpatterned device layer 104 disposed on the substrate 102.

Substrate 102 may itself comprise multiple layers, for example without limitation, one or more unpatterned or patterned device layers. For example, while the unpatterned device layer 104 is shown on one side (e.g. the "top" in the orientation of the figures) of the substrate 102, this disclosure also contemplates "double-sided" processing of device 100, for example, wherein substrate 102 comprises a second unpatterned device layer situated so as to comprise the opposing side (e.g. the "bottom") of the substrate 102. In exemplary embodiments, such "bottom" side unpatterned device layer is subject to a similar patterning process as the "top" side unpatterned device layer 104, and such "bottom" side patterning occurs in whole or in part before, after, or during the "top" side patterning of unpatterned device layer 104. In exemplary embodiments, substrate 102 may comprise one or more patterned device layers processed according to one or more exemplary embodiments, for example without limitation, in a manner similar to the manner used to process unpatterned device layer 104.

In one exemplary embodiment, device 100 is a PCB in the process of manufacturing, unpatterned device layer 104 comprises an electrically conductive material, thereby making it an unpatterned electrically conductive device layer, substrate 102 comprises one or more layers of electrically insulating material configured to provide a "top" electrically insulating surface and a "bottom" electrically insulating surface, and the unpatterned electrically conductive device layer 104 is situated to be adjacent to the "top" electrically insulating surface. A second unpatterned electrically conductive device layer is incorporated into substrate 102 and situated to be adjacent to the "bottom" electrically insulating surface (wherein such "bottom" electrically insulating surface is within substrate 102 and not shown in FIG. 1), and the "bottom" surface of substrate 102, namely the surface on the opposite side of substrate 102 relative to the surface adjacent to unpatterned device layer 104, is a surface of the second unpatterned electrically conductive device layer.

In one exemplary embodiment, device 100 is a PCB in the process of being manufactured, and substrate 102 has an electrically insulating surface over a region comprising at least a portion of the interface between substrate 102 and unpatterned device layer 104. In one exemplary embodiment, substrate 102 may comprise a layer of an electrically insulating material such as, for example and without limitation, composite materials including woven glass bonded by epoxy resins or other materials. Such electrically insulating material may have, for example, a thickness in a range from about 0.001 inches to about 0.05 inches. In one exemplary embodiment, substrate 102 may comprise multiple alternating layers of electrically insulating material and electrically conductive material, further comprising at least two electrically insulating layers, each layer comprising woven glass bonded by epoxy resins or other materials and having a thickness between 0.001 inches and 0.05 inches, for example, one "core" layer and one layer comprising a pre-impregnated bonding sheet (which may be referred to as a "PrePreg"), and at least one patterned electrically conductive layer situated in between the electrically insulating layers, wherein the "top" surface of substrate 102 interfacing with unpatterned device layer 104 is a surface of one of the at least two electrically insulating layers. In an exemplary embodiment, a PrePreg comprises an FR4 grade epoxy laminate sheet. In an exemplary embodiment, a core layer comprises an FR4 grade epoxy laminate sheet.

The unpatterned device layer 104 may comprise a layer of conductive material, such as, for example, a metal or metal alloy including but not limited to copper, aluminum, silver, gold, or other conductive materials with which those having ordinary skill in the art are familiar. In an exemplary embodiment, the unpatterned device layer 104 is a copper foil laminated onto substrate 102, wherein the interface surface between substrate 102 and unpatterned device layer 104 is electrically insulating; however, other conductive materials are considered within the scope of this disclosure.

Figure 1B:
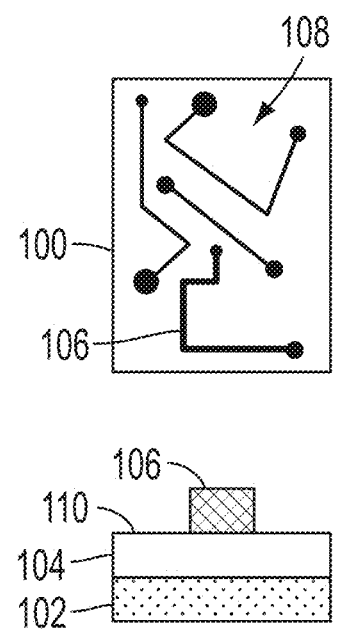
Figure 1C:
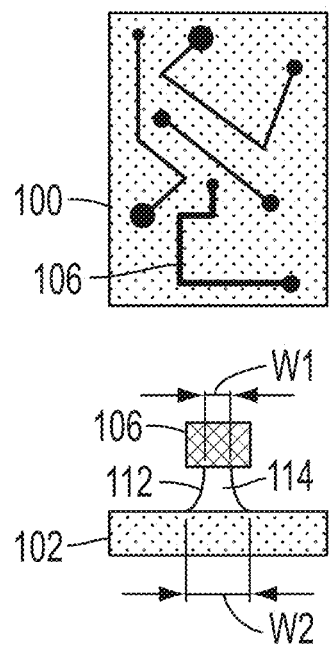

Referring now to FIG. 1B, in a next stage of processing, an etch mask 106 is formed on the exposed surface 110 of the unpatterned device layer 104. The etch mask 106 may be formed in a desired pattern 108, such as lines corresponding to where patterned device layer lines are desired on the device 100 following processing, as shown in FIG. 1B. Stated another way, the etch mask 106 may comprise etch-resist material deposited over the unpatterned device layer 104 in locations corresponding to where patterned device layer features are desired in the device 100. The etch mask 106 may comprise a material such as, for example, a polymer, an oxide, a nitride, or other materials. In one exemplary embodiment, the etch mask material is a polymer that is formed using a negative tone photo-resist material, for example without limitation, one of the SU-8 series of photoresists supplied by MicroChem Corp., 200 Flanders Road, Westborough, Mass. 01581 USA. In one exemplary embodiment, the etch mask material is a polymer that is formed using a positive tone photo-resist material, for example without limitation, one of the ma-P 1200 series photoresists supplied by micro resist technology GmbH., Köpenicker Str. 325, 12555 Berlin, DE. The etch mask 106 may be patterned over the surface of the unpatterned device layer 104 by methods such as silkscreen printing, inkjet printing, photolithography, gravure printing, stamping, photoengraving, or other methods. After the etch mask 106 is applied to the surface 110 of the unpatterned device layer 104, the device 100 is exposed to an etchant, such as a chemical etchant, that removes the material in unpatterned device layer 104 from those areas not protected by the etch mask 106, resulting in the formation of patterned device layer 114, as shown in FIG. 1C. Such a chemical etchant may comprise chemical compounds that have a corrosive effect on the material of the unpatterned device layer 104. In exemplary embodiments, unpatterned device layer 104 is an electrically conductive layer and such a chemical etchant may comprise, without limitation, ammonium persulfate, ferric chloride, or other chemical compounds that have a corrosive effect on the material of the unpatterned device layer 104. In one embodiment, the unpatterned electrically conductive device layer 104 comprises copper, and the etchant used is copper chloride ($CuCl_2$). Those having ordinary skill in the art are familiar with various chemical etchants suitable for removal of the material of the unpatterned device layer 104.

Figure 1D:
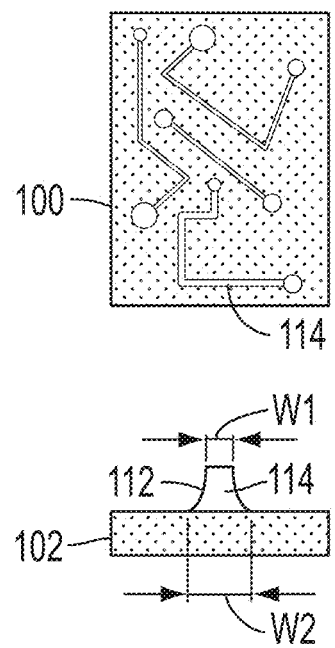
Figure 3A:
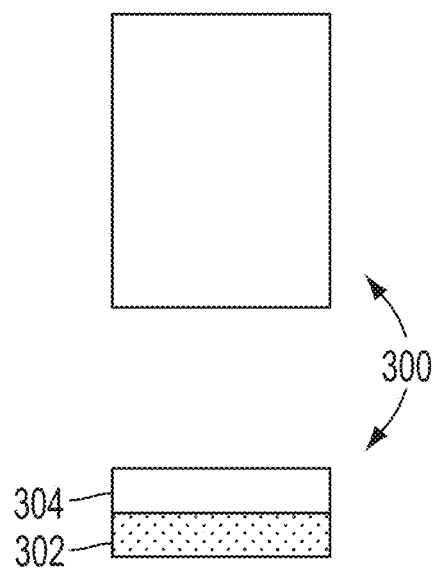
FIGS. 3A and 3B show cross-sectional and plan views of a device undergoing another conventional process for forming a patterned layer on a substrate.
Figure 3B:
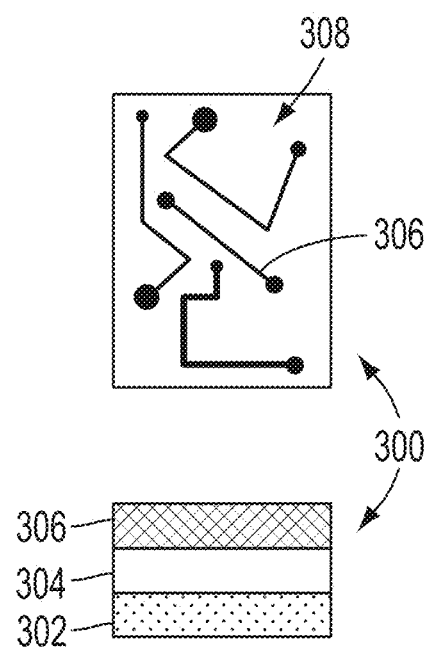

With continued reference to FIG. 1C, when the unpatterned device layer 104 is exposed to the etchant, the etchant dissolves (e.g., corrodes) the material of the unpatterned device layer 104 beginning with the exposed top surface 110. As the material of the unpatterned device layer 104 is removed, the etchant may also remove portions of the material of the unpatterned device layer 104 underneath the etch mask 106, leaving non-straight, and non-perpendicular sidewalls 112. For example, as shown in FIG. 1C, in the device 100 produced according to the process shown in FIGS. 1A-1D, the sidewalls 112 of a feature of patterned device layer 114 produced according to the pattern 108 of the etch mask 106 may exhibit a tapered shape, e.g., tapering from a first feature width W1 at an interface between the patterned device layer 114 and the etch mask 106, to a second feature width W2 wider than the first feature width W1 at an interface between the substrate 102 and the patterned device layer 114. FIG. 1D shows the device 100 after the etch mask 106 is removed, exposing the patterned device layer 114. The tapered shape exhibited in FIG. 1D by the sidewalls 112 of the feature of the patterned device layer 114 is one illustration of sidewalls that are "undercut," and will be discussed in further detail in connection with FIGS. 4A-4C below. Other shapes and arrangements of undercut sidewalls also may occur and include sidewalls that are not substantially straight and do not extend substantially perpendicular to the surface of the substrate on which they are formed.

Referring now to FIGS. 2A-2C, a method of forming an etch mask 206 having a pattern 208 of conductive lines is shown. A device 200 having a substrate 202 and an unpatterned device layer 204 is covered over the entire area (i.e., blanket coated) of the unpatterned device layer 204 with unpatterned etch-resist layer 216. The unpatterned etch-resist layer 216 is then exposed to light (e.g., UV light) in a pattern so that the exposed regions are made relatively less susceptible to removal in a subsequent development process (so-called negative-tone processing) or so that the exposed regions are made relatively more susceptible to removal in a subsequent development process (so-called positive-tone processing). Such pattern-wise using light exposure may be accomplished, for example, by shining light through a photo-mask, as in so-called photolithographic processing, or by delivering to the etch-resist layer 216 a sequence of pulses or scans of a focused light, e.g. in the form of a laser beam, in a pattern as a function of time, so-called direct-write processing. The development process removes the material in the unpatterned etch-resist layer 216 in correspondence with the pattern-wise light exposure resulting in the patterned etch mask 206, having the pattern 208, as shown in FIG. 2C. The development process may include submerging the device 200 in a liquid developer that dissolves or corrodes the material in the unpatterned etch mask layer 216 where it is relatively more susceptible to removal, for example without limitation, in the case of a negative tone process, the developer liquid may dissolve the material in the unpatterned etch-resist layer 216 where it has not been exposed to UV light, whereas in the case of a positive tone process, the developer liquid may dissolve the material in the unpatterned etch-resist layer where it has been exposed to UV light. Removal of portions of the unpatterned device layer 204 not protected by the etch mask 206 then proceeds as discussed above in connection with FIG. 1D, resulting in the device 200 with a patterned device layer having features in the pattern 208 and exhibiting undercutting.

Alternatively, the etch mask may be deposited directly on the unpatterned device layer in the desired pattern, with no intermediate step of patterning an unpatterned etch-resist layer as in the embodiment of FIGS. 2A-2C. For example, with reference now to FIGS. 3A and 3B, an etch mask 306 may be formed over an unpatterned device layer 304 of device 300 directly in a desired pattern 308 of lines corresponding to where features of patterned device layer are desired on the resulting device. The etch mask 306 may be deposited on the unpatterned device layer 304 in the desired pattern 308 by, for example, inkjet printing, laminating, screen printing, gravure printing, stamping, or other methods. In one exemplary embodiment, etch mask 306 is formed over unpatterned device layer 304 using inkjet printing, wherein an inkjet printhead having a plurality of nozzles ejects droplets of a liquid etch-resist ink onto the device 300 so as to form a coating of liquid etch resist ink in correspondence with the pattern 308, and such coating of liquid etch resist ink is subsequently processed so as to convert the liquid coating into the etch mask 306. In one exemplary further embodiment, the processing of the liquid etch resist ink comprises drying and/or baking the device so as to form a solid etch mask 306 from the liquid coating. In one exemplary embodiment, etch mask 306 is formed over unpatterned device layer 304 using an inkjet printer comprising one or more printheads comprising a plurality of nozzles, a substrate support that holds the substrate, a stage for relatively moving the plurality of nozzles and the substrate, a motion control system for controlling the relative position of the substrate and the nozzles, and a nozzle control system for controlling the firing of the nozzles so as to deliver droplets onto the substrate in the desired pattern. It is contemplated in this disclosure that in any embodiment wherein inkjet printing is utilized to deposit a liquid coating, an inkjet printing system such as described here may be used.

Figure 4A:
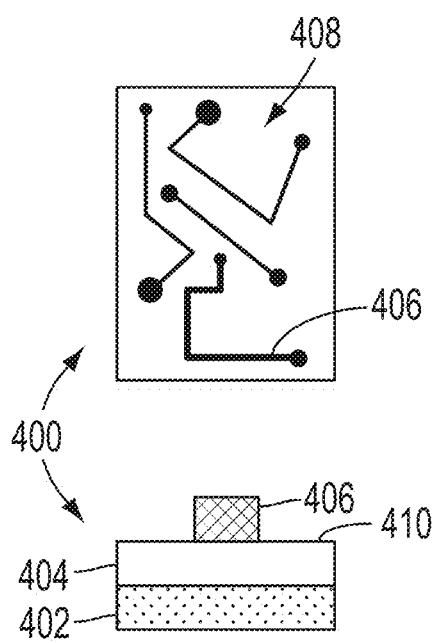
FIGS. 4A-4C show cross-sectional and plan views of a device undergoing another conventional process for forming a patterned layer on a substrate.
Figure 4B:
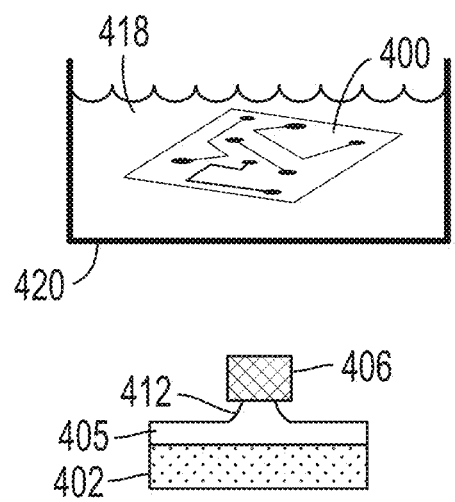
Figure 4C:
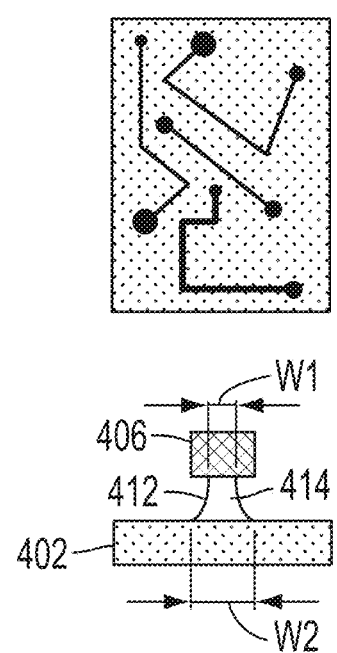

FIGS. 4A-4C illustrate a conventional process for removing material from an unpatterned device layer 404 from a device 400 and depicts what is believed to occur during a wet-etching process that causes undercutting. In FIG. 4A, the unpatterned device layer 404 is covered by etch mask 406 in correspondence with pattern 408. The device 400 is then exposed to a chemical etchant 418. In the exemplary embodiment of FIG. 4B, the exposure occurs by immersion in the etchant 418. The etchant 418 removes material from the unpatterned device layer 404 (from FIG. 4A) to create partially patterned device layer 405. For example, in the embodiment of FIG. 4B, the etchant 418 comprises a liquid, for example with limitation, a solution, contained within a vessel 420, and the device 400 with the etch mask 406 (FIG. 4B) is immersed in the etchant 418, as shown in FIG. 4B. Once the exposed portion of top surface 410 (FIG. 4A) of the unpatterned conductive layer 404 is etched away and a sidewall 412 begins to form, the sidewall 412 is exposed to the etchant 418 and the etchant 418 removes material from the sidewall 412, leading to the tapered, undercut shape of the feature of the patterned device layer 414 shown in FIG. 4C. Stated another way, the etchant 418, which may act universally in all directions, attacks the material comprising the device layer (whether the device layer is in its unpatterned, i.e. 404, partially patterned, i.e. 405, or patterned, i.e. 414, state) laterally underneath the etch mask 406 as soon as the top surface 410 of unpatterned device layer 404 is etched away. The amount of the material of the device layer removed by the etchant 418 may be dependent upon the amount of time to which the material of the device layer is exposed to the etchant 418. Thus, as the etchant 418 advances through a thickness of the partially patterned device layer 405 (i.e., in the direction normal to the plane of substrate 402), the portions of the sidewalls 412 closer to the etch mask 406 are exposed to the etchant 418 for a longer time period than the portions of the sidewalls 412 closer to substrate 402, and the etching process thereby imparts to the sidewalls 412 the tapered (i.e., undercut) shape shown in FIG. 4C. In other words, the time the etchant reacts with the material in the device layer to remove such material from the device layer increases with the distance from the substrate. While not wishing to be bound by any particular theory, it is believed therefore that the additional reaction time between the etchant and material in those portions of the device layer further from the substrate results in an erosion (removal) of the material from the device layer laterally inward in regions of the device layer directly under and proximate the etch mask, despite that the intent of the etch mask is to prevent the removal of the material of the device layer in those areas.

Figure 5A:
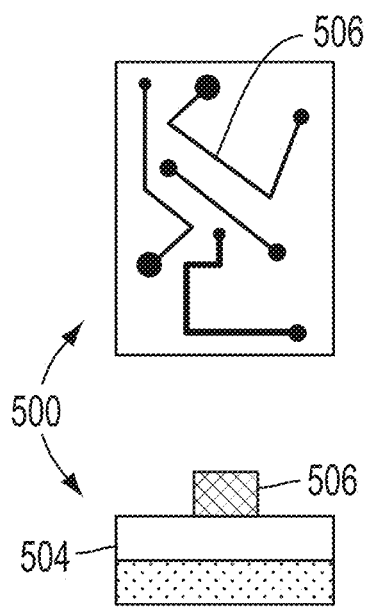
FIGS. 5A-5C show cross-sectional, plan, and perspective views of a device undergoing another conventional process for forming a patterned layer on a substrate.
Figure 5B:
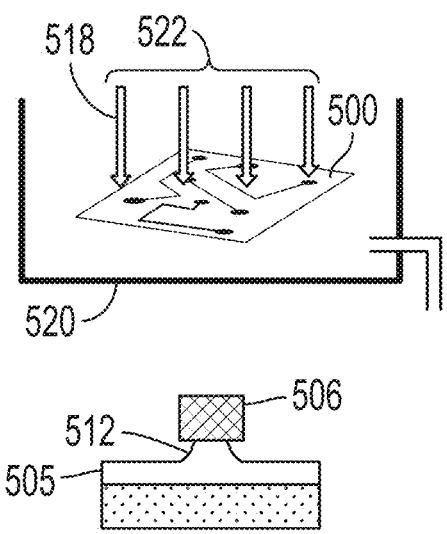
Figure 5C:
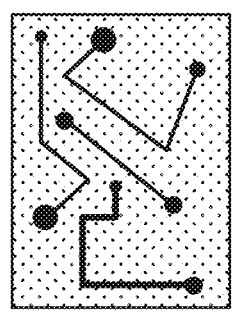

Referring now to FIG. 5A-5C, an embodiment of another conventional process is shown. The process of FIGS. 5A-5C is similar to that described in connection with FIGS. 4A-4C, and includes forming an etch mask 506 over an unpatterned device layer 504 of a device 500, as shown in FIG. 5A. Rather than immerse the device 500 within the etchant 518, as described above in connection with FIG. 4B, the etchant 518 is introduced in jets 522 that impinge the device 500, which may be in a vessel 520, as shown in FIG. 5B. Excess etchant 518 can flow into a drain 524 of the vessel 520 or otherwise be collected, e.g., for recirculation or other processing. Because the etchant 518 acts omnidirectionally, a taper or undercut forms on the resulting sidewall 512 of the feature of patterned device layer 514, as shown in FIG. 5C.

As discussed above, having the undercut sidewalls of the features of the patterned device layer formed on a device introduce various limitations on the size and shape of features that may be formed. For example, as discussed above, the tendency for undercuts to form may impose limits on the minimum feature width or minimum feature-to-feature spacing capable of being produced, thereby limiting feature density on the device. In various applications, maximizing feature density on the device improves performance. In various embodiments, the device layer comprises an electrically conductive material, the device is a PCB, and the tendency for undercuts may limit the minimum feature width, the minimum feature-to-feature spacing, and the maximum feature density.

Figure 6A:
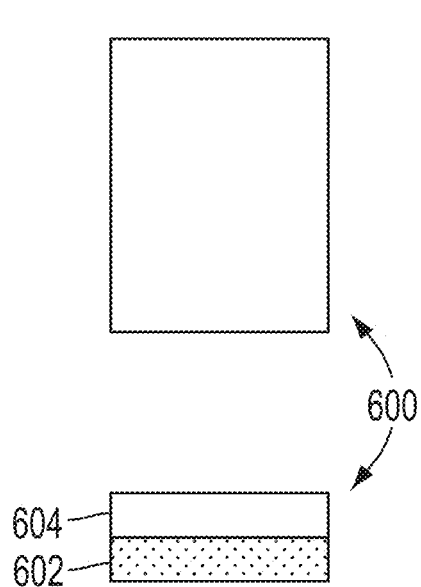
FIGS. 6A-6D show cross-sectional and plan views of a device undergoing a process for forming a patterned layer on a substrate according to an exemplary embodiment of the present disclosure.

FIGS. 6A-17 show various embodiments of processes for mitigating (e.g., reducing or eliminating) the undercut that occurs during conventional processing. For example, with reference now to FIG. 6A, a device 600 has an unpatterned device layer 604 over substrate 602. The unpatterned device layer 604 may be applied to the substrate by chemical vapor deposition, physical vapor deposition, laminating, slot die coating, spin coating, inkjet printing, screen printing, nozzle printing, gravure printing, rod coating, or any other suitable method, as those having ordinary skill in the art are familiar. The unpatterned device layer 604 is coated with an anti-corrosive layer 629 prior to forming the etch mask 628 above the anti-corrosive layer 629. The anti-corrosive layer 629 may be applied to the substrate by chemical vapor deposition, physical vapor deposition, laminating, slot die coating, spin coating, inkjet printing, screen printing, nozzle printing, gravure printing, rod coating, or any other suitable method, as those having ordinary skill in the art are familiar. In some embodiments, the anti-corrosive layer 629 comprises a "primer" layer, and the etch mask 628 is formed by depositing onto the primer layer a liquid etch-resist ink which is converted into the etch mask 628 via subsequent processing, for example without limitation, drying or baking. In various embodiments, as described previously, such liquid etch-resist ink may be delivered to the device 600 in the form of droplets via inkjet printing and may interact with the anti-corrosive layer 629 (which in such case is functioning as a primer layer) in a manner that such droplets, upon contact with the primer surface are rapidly (e.g., on the order of micro-seconds) effectively immobilized or "frozen" in place such that further translation or spreading of the ink droplet on the primer surface is greatly reduced or stopped entirely, as discussed further in Int'l Pub. Nos. WO2016/193978 A2 and WO2016/025949 A1, incorporated by reference above. Such a liquid etch-resist ink may further produce via interaction with such a primer layer a bi-component material that at least in part forms the etch resist mask In various embodiments, with reference to FIG. 6A, a device 600 is a PCB, unpatterned device layer 604 comprises an electrically conductive material such as copper, aluminum, gold, and/or other metals, and the surface of substrate 602 adjacent to unpatterned electrically conductive device layer 604 is electrically insulating.

In exemplary embodiments, the anti-corrosive layer 629 may comprise materials chosen based on their ability to impede the corrosive effects of a chemical etchant used to remove the material of the unpatterned device layer 604 of the device 600. As non-limiting examples, the anti-corrosive layer 629 may comprise, without limitation, a polymer, an organic compound such as an organic compound comprising one or more -imine groups, one or more -amine groups, one or more -azole groups, one or more -hydrazine groups, one or more amino acids, a Schiff base, or other materials. In other exemplary embodiments, the anti-corrosive layer 629 may comprise inorganic materials such as a chromate, a molybdate, a tetraborate, or another inorganic compound. In some exemplary embodiments, the anti-corrosive layer 629 may comprise a reactive component, such as one or more reactive cationic groups comprising polycations and/or multivalent cations. The cationic reactive component may be capable of adhering to metallic surfaces, such as copper surfaces.

In some embodiments, the anti-corrosive layer 629 may be formed by applying a liquid anti-corrosive ink over the unpatterned device layer using any known application method, for example without limitation, spraying, spin coating, nozzle printing, rod coating, screen printing, smearing, ink-jet printing or the like, and then processing the device 600 so as to convert the liquid coating into the anti-corrosive layer 629. In some embodiments, anti-corrosive layer 629 may be referred to as a primer layer, and the liquid anti-corrosive ink may be referred to as a primer ink. The liquid anti-corrosive ink may comprise a solution that may include poly-imines such as, for example, polyethyleneimines, such as linear polyethyleneimines or branched polyethyleneimines, having low or high molecular weights. As a non-limiting example, the molecular weights may range from about 800 to about 2,000,000.

In some embodiments, to make the liquid anti-corrosive inkjettable via ink-j et printheads, the liquid ink may be an aqueous solution that may include additional agents such as Propylene glycol, n-Propanol and a wetting additive (such as TEGO 500 supplied by Evonik Industries).

In some embodiments, the thickness of the anti-corrosive material layer 629 may be in a range of from about 0.03 μm to about 1.1 μm. In some embodiments, the method may include drying the applied ink using any drying method to form a solid coating. In some embodiments, the method may include baking the applied ink using any drying method to form a solid coating.

As further non-limiting examples, if present, the cationic reactive component of anti-corrosive material layer 629 may comprise polyamides, such as polyethyleneimine, poly-quaternary amines, long-chain quaternary amines, poly-tertiary amines at various pH levels and multi-valent inorganic cations such as magnesium cation, zinc cation, calcium cation, copper cation, ferric cation, and ferrous cation. The polymeric components may be introduced to the formulation either as soluble components or in emulsion form.

The anti-corrosive material layer 629 may be applied to the unpatterned device layer 604 using any suitable printing or coating method including but not limited to, inkjet printing, spraying, metering rod coating, roll coating, dip coating, spin coating, screen printing, laminating, stamping and others. The anti-corrosive layer 629 may be applied uniformly over the unpatterned device layer 604, or applied in a desired pattern, such as in the pattern 608 defining the desired pattern of the patterned device layer 630 (in accordance with FIG. 6.)

In the exemplary embodiment of FIGS. 6A-6D, the anti-corrosive layer 629 may comprise a "primer" layer, and the etch mask 628 may be formed by depositing onto the primer layer a liquid etch-resist ink which is converted into the etch mask 628 via subsequent processing, for example without limitation, drying or baking. In various embodiments, such drying may comprise baking, for example without limitation at 70° C. or higher. In various embodiments, as described previously, such liquid etch-resist ink may be delivered to the device 600 in the form of droplets via inkjet printing and may interact with the primer layer in manner that such droplets, upon contact with the primer surface are rapidly (e.g., on the order of micro-seconds) immobilized or "frozen" in place such that further translation or spreading of the ink droplet on the primer surface is greatly reduced or stopped entirely, as discussed further in Int'l Pub. Nos. WO2016/193978 A2 and WO2016/025949 A1, incorporated by reference above. Such a liquid etch resist ink may further produce via interaction with such a primer layer and bi-component material that at least in part forms the etch mask The etch mask 628, or, a liquid etch-resist ink used to make such etch mask 628 (according to various embodiments as described above) may comprise polymeric components that are water-soluble and may include anionic groups. The anionic polymer may be selected from acrylic resins and styrene-acrylic resins in their dissolved salt forms. The anionic polymer may be selected from sulphonic resins in their dissolved salt form, such as sodium, ammonium- or amine-neutralized form. In embodiments utilizing a liquid etch resist ink, the liquid ink may include additional agents for improving the printing or other deposition quality of the material.

The etch mask 628, or, a liquid etch-resist ink used to make such etch mask 628 (according to certain embodiments as described above) may comprise a reactive component that may be water-soluble and may include reactive anionic groups. Non-limiting examples of anionic reactive components may include at least one anionic polymer (in a base form) at pH higher than 7.0. The anionic polymer may be selected from acrylic resins and styrene-acrylic resins in their dissolved salt forms. The anionic polymer may be selected from sulphonic resins in their dissolved salt form, for example without limitation, sodium salt form, ammonium or amine neutralized form, as well as in the form of a polymer emulsion or dispersion. Polymeric components may be introduced to the formulation either as soluble components or in emulsion form.

Figure 6B:
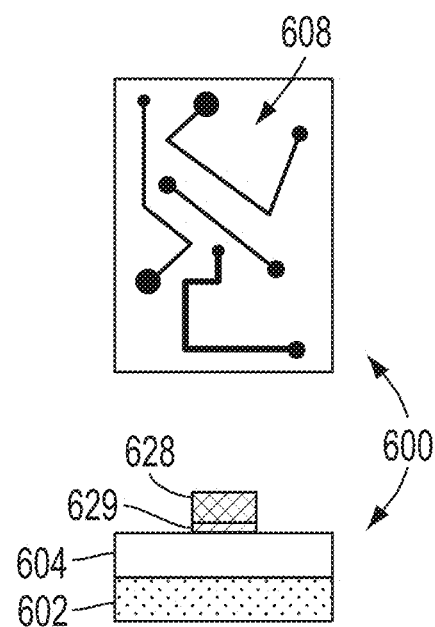

Referring to FIG. 6B, the anti-corrosive layer 629 and the etch mask 628 may be directly printed on the device 600. In one exemplary embodiment, the anti-corrosive layer 629 may be formed via printing over the unpatterned device layer 604 in a desired pattern, such as pattern 608, so as to facilitate the fabrication of a correspondingly patterned device layer 630 (as in FIG. 6.) The anti-corrosive layer 629 may be deposited with a thickness ranging from about 5 nm to about 100 nm, of about 100 nm or less, or of about 1 µm or less. Other thicknesses of the anti-corrosive material layer 629 are considered within the scope of the disclosure and may depend on the particular application. The etch mask 628 is then formed via printing over the anti-corrosive material layer 629 in a desired patterned, such as pattern 608, so as to facilitate the fabrication of a correspondingly patterned device layer 630 (as in FIG. 6). The etch mask 628 may be deposited, for example, so as to have a thickness ranging from about 1 µm to about 5 µm, or of about 5 µm or less, or of about 15 µm or less.

Figure 6C:
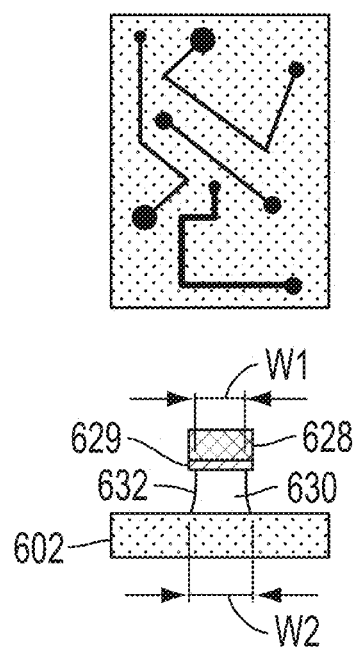
Figure 6D:
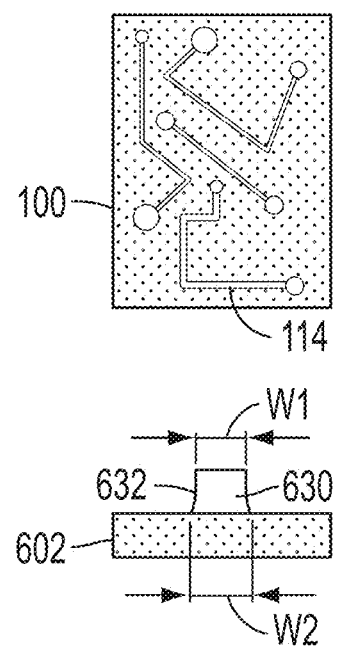

The device 600 is then introduced to an etchant, such as a liquid chemical etchant 418 or 518 as discussed in connection with FIGS. 4B and 5B. Presence of the anti-corrosive material layer 629 may contribute to a decreased amount of undercutting of a feature of a patterned device layer 630, as shown in FIGS. 6C and 6D. For example, the feature of patterned device layer 630 may exhibit a first width W1 proximate the anti-corrosive layer 629, and a second width W2 proximate the substrate 602. In some exemplary embodiments, a difference between the width W1 and W2 results in the feature of patterned device layer 630 exhibiting tapered sidewalls 632 (i.e., the feature of patterned device layer 630 may exhibit some degree of undercut). The undercut exhibited by the feature of patterned device layer 630 may be less than the undercut exhibited by the features of patterned device layers 114, 414 (FIGS. 1D and 4D) discussed above. Various measurements may be used to quantify the degree of undercut, as discussed in greater detail below in connection with FIGS. 10 and 11.

In the exemplary embodiment of FIGS. 7A-7C, an anti-corrosive layer 729 is blanket deposited over the surface of an unpatterned device layer 704 disposed on a substrate 702. Such blanket coating may be done by methods such as, without limitation, chemical vapor deposition, physical vapor deposition, laminating, inkjet printing, spraying, metering rod coating, roll coating, dip coating, spin coating, screen printing, nozzle printing, or other methods. An etch mask 728 may be formed over the anti-corrosive layer 729 in a desired pattern, such as the pattern 708 as discussed with respect to various embodiments above. The method proceeds similarly to the embodiment of FIGS. 6A-6C described above. For example, the device 700 with the anti-corrosive layer 729 and etch mask 728 is exposed to an etchant, such as etchant 418 or 518 discussed in connection with FIGS. 4B and 5B. As shown in FIG. 7B, the device 700 is placed in a vessel 720, and an etchant 718 is jetted over the surface of the device 700 on which the etch mask 728 is disposed. The etchant 718 may remove the anti-corrosive layer 729 from the surface of the unpatterned device layer 704 and expose the material of unpatterned device layer 704, which is removed by the etchant 718 as shown in FIG. 7B, to form patterned device layer 730 having sidewalls 732 exhibiting a reduced degree of undercut as compared to sidewalls 112 associated with patterned device layer 114, 414 produced according to conventional processes. Partially patterned device layer 705 reflects the intermediate state of the device layer after anti-corrosive layer 729 has been removed from those regions exposed through the etch mask and some of the material of the device layer itself has been etched away, and before the etching has progressed sufficiently to form the patterned device layer 730.

Figure 8A:
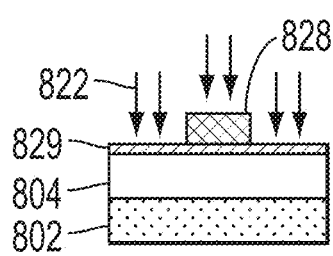
FIGS. 8A-8D show cross-sectional views of a device undergoing a process for forming a patterned layer on a substrate according to another exemplary embodiment of the present disclosure.
Figure 8B:
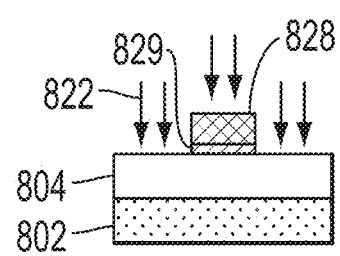
Figure 8C:
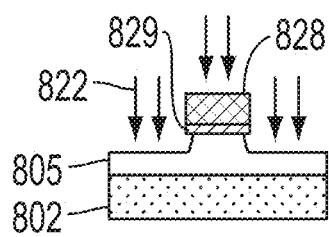
Figure 8D:
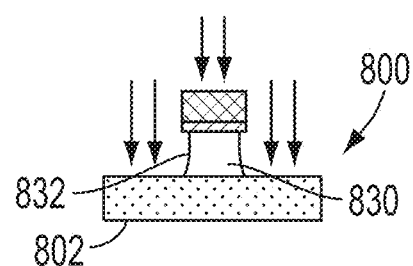

Referring now to FIGS. 8A-8D, a more detailed illustration of a portion of the process of the embodiment of FIGS. 7A-7C is shown. In FIG. 8A, jets 822 of an etchant (such as etchant 718 in FIG. 7B) impinge the surface of an anti-corrosive layer 829 and an etch mask 828 that are deposited on an unpatterned device layer 804 on substrate 802. The anti-corrosive layer 829 may preferentially adhere to the surface of the material of the device layer and may also be at least partially soluble in the etchant 718, while the etch-resist material 828 may be substantially insoluble in the etchant 718. The jets 822 of etchant 718 may contain sufficient kinetic energy to remove the anti-corrosive layer 829 from the unpatterned device layer 804 in those regions exposed through the etch mask, as shown in FIG. 8B, and thereafter the etchant 718 may start removing the material of the unpatterned device layer 804 not covered by the etch-resist material 828 and form partially patterned device layer 805 as shown in FIG. 8C. FIG. 8D shows the device 800 after the partially patterned device layer 805 has been sufficiently etched to form patterned device layer 830. As shown in FIG. 8D, patterned device layer 830 has sidewalls 832 that exhibit less undercut than the sidewalls produced according to the conventional process described in connection with FIGS. 1A-5C. While the patterned device layer 830 is shown with a slight undercut in FIG. 8D, the present disclosure contemplates patterned device layer (e.g., conductive) features with substantially no undercut (i.e., substantially straight and extending perpendicular to the surface of substrate 802).

Figure 9A:
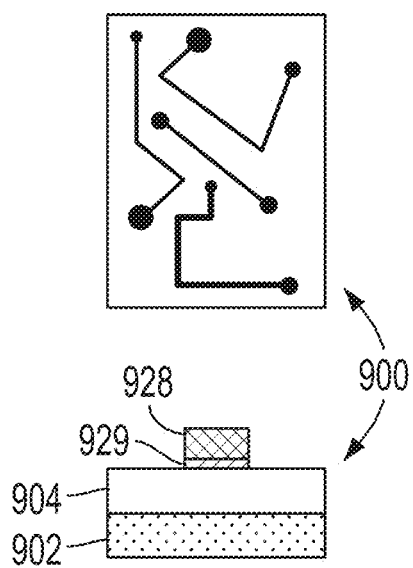
FIGS. 9A-9C show cross-sectional views of a device undergoing a process for forming a patterned layer on a substrate according to another exemplary embodiment of the present disclosure.
Figure 9B:
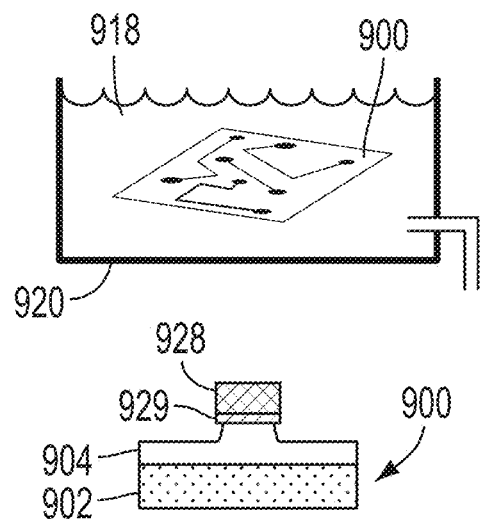
Figure 9C:
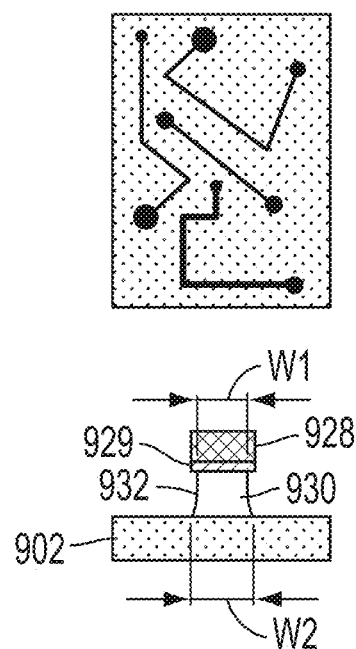

Referring now to FIGS. 9A-9C, another embodiment of a process for forming a patterned device layer 930 on a device 900 is shown. An unpatterned device layer 904 disposed over a substrate 902 is masked with an anti-corrosive layer 929 and an etch mask 928. The device 900 is introduced into a vessel 920 with an etchant 918 such that the device is immersed within the etchant 918 in FIG. 9B. As shown in FIG. 9C, a resulting patterned device layer 930 of the device 900 has sidewalls 932 exhibiting a degree of undercut less than an undercut exhibited by the conductive feature 114 (FIG. 1D) associated with a conventional process.

Figure 10:
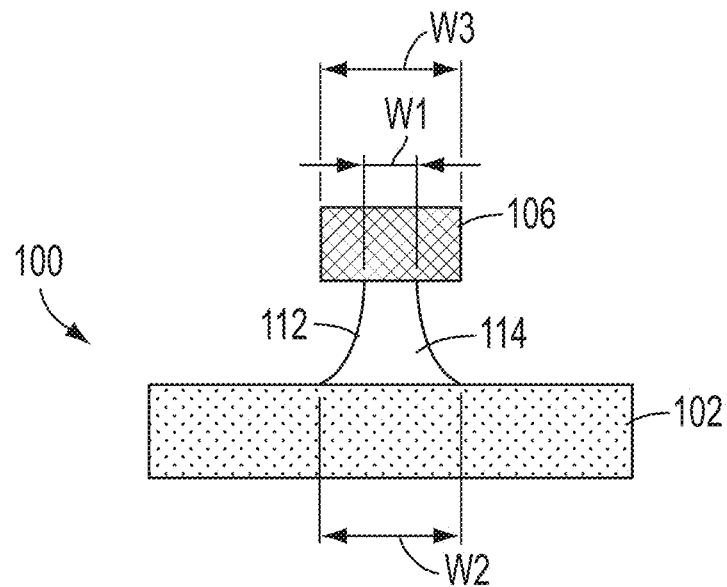
FIG. 10 shows a cross-sectional view of a device during processing to form a patterned layer on a substrate according to a conventional process.

Referring now to FIG. 10, an enlarged view of the device 100 discussed in connection with the conventional methods of FIGS. 1A-5C is shown. In FIG. 10, the feature of the patterned device layer 114 exhibits a tapered sidewall extending between an interface of the etch mask 106 and the patterned device layer 114 and an interface between the patterned device layer 114 and the substrate 102. The patterned device layer feature 114 exhibits a first width W1 at the interface of the patterned device layer 114 and the etch mask 106 and a second width W2 at the interface of the patterned device layer 114 and the electrically insulating substrate 102. FIG. 10 is drawn for illustrative purposes and variations of the profile can occur, but generally the patterned device layer 114 has a wider width at the interface with the substrate than the interface with the etch-resist material. It is noted that etch mask 106 has a width W3 which this disclosure contemplates being greater than, less than, or the same as width W2.

Figure 11:
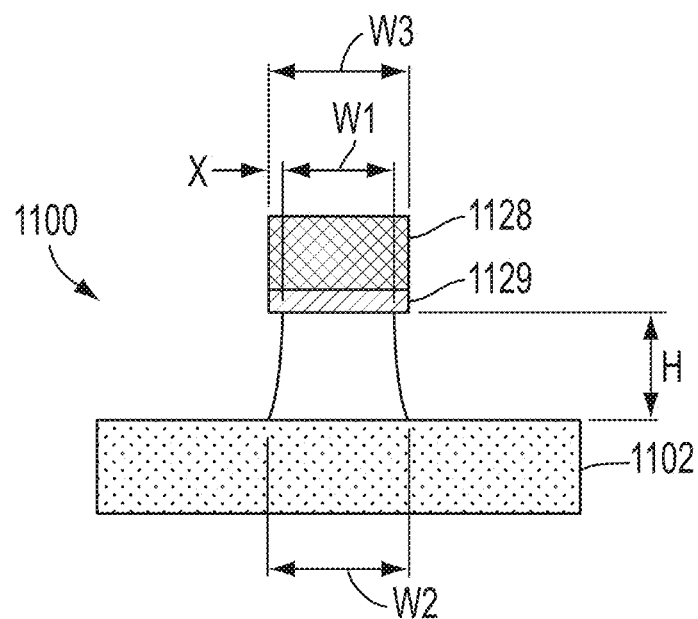
FIG. 11 shows a cross-sectional view of a device during processing to form a patterned layer on a substrate according to an exemplary embodiment of the present disclosure.

Referring now to FIG. 11, an enlarged view of a device 1100 similar to the device 600, 700, 800, or 900 shown in FIGS. 6A-9C is shown. In this exemplary embodiment, the feature of the patterned device layer 1130 exhibits a first width W1 at the interface between the patterned device layer 1130 and an anti-corrosive layer 1129, and a second width W2 at the interface between the patterned device layer 1130 and the substrate 1102. It is noted that etch mask 1128 has a width W3 which this disclosure contemplates being greater than, less than, or the same as width W2.

An exemplary measure for the degree of undercut is the etch factor F, which is a ratio of the difference in the widths of the widest and narrowest parts of the feature of the patterned device layer and the height of the feature of the patterned device layer. Accordingly, the etch factor F is defined as H/X where H is the height of the line (H) and X equals $(W_2-W_1)/2$, namely, the difference between of the base portion width (W2) and the top portion width (W1) divided by two. FIG. 11 graphically demonstrates the relations between H and X. Exemplary values of etch factors F for features of patterned device layers of the present disclosure are discussed below with Examples 1-3. As non-limiting examples, features of device layers associated with devices manufactured according to various exemplary embodiments of the present disclosure may exhibit etch factors F of greater than 2, greater than 5, greater than 7, or more, such as greater than 10, greater than 20, etc. As a further example, an etch factor F of a conductive feature with sidewalls approaching a vertical line (i.e., exhibiting no undercut) would approach infinity as the value of X approaches zero. Measurements of H, W1, and W2 may be performed using a variety of microscopy techniques that measure surface profiles, cross sections, and film thicknesses, for example and without limitation, surface profilometry, scanning electronic microscopy, ellipsometry, and confocal microscopy.

Figure 12A:
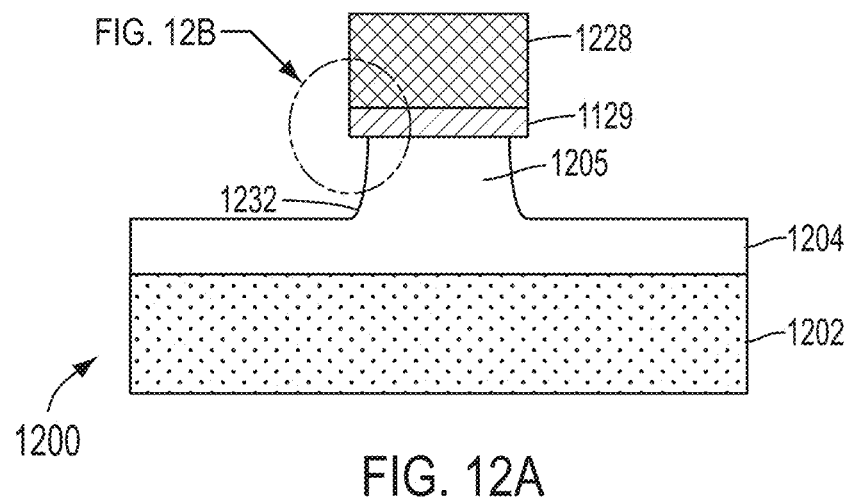
FIG. 12A is a cross-sectional view of a device during processing to form a patterned layer on a substrate according to an exemplary embodiment of the present disclosure.
Figure 12B:
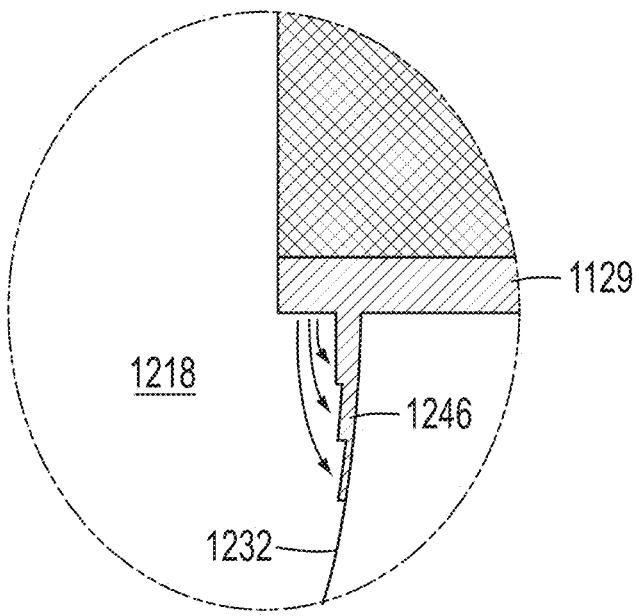
FIG. 12B is an enlarged view of the portion in circle 12B of FIG. 12A.

While not wishing to be bound by a particular theory, the inventors believe that portions of the anti-corrosive material layer dissociate from the layer and adhere to and/or adsorb onto the side wall of the device layer under the etch mask during the etching process so as to mitigate undercutting. FIGS. 12A and 12B depict this phenomenon.

FIG. 12A shows a cross-sectional view of a device 1200 during an intermediate processing step in a patterning process in accordance with various exemplary embodiments of the present disclosure. As shown, a partially patterned device layer 1205 on a substrate 1202 is undergoing an etching process. FIG. 12B shows an enlarged view of a portion of FIG. 12A at an interface between a sidewall 1232 of a partially patterned device layer 1205 and an anti-corrosive layer 1229. As shown in FIG. 12B, when the device 1200 is exposed to etchant 1218, a portion 1246 of the anti-corrosive material comprising the anti-corrosive layer 1229 dissociates from anti-corrosive layer 1229 due to the action of the etchant 1218, for example without limitation, by partially dissolving the anti-corrosive layer, and such anti-corrosive material then travels to and adheres to and/or adsorbs onto the sidewall 1232. Stated another way, the presence of the etchant 1218 may facilitate transfer of a portion 1246 of the anti-corrosive material comprising the anti-corrosive layer 1220 from the anti-corrosive material layer 1229 to the sidewall 1232 of the partially patterned device layer 1230 during the etching process. Presence of the anti-corrosive material portion 1246 on the sidewall 1232 may then inhibit the corrosive action of the etchant 1218 on the sidewall 1232, thereby decreasing (e.g., reducing or eliminating) the amount of undercut exhibited in the resulting patterned device layer 1230. In various exemplary embodiments, it is believed that at least two processes contribute to these phenomena, wherein in one process the anti-corrosive material is dissolved by the etchant and in another, simultaneous process, the anti-corrosive material dissolved in the etchant is adsorbing onto and/or adhering to the sidewall 1232. In various exemplary embodiments, the rates of the first and the second processes are such that anti-corrosive material portion 1246 is formed and maintained during the etching process so as to decrease (e.g. reduce or eliminate) the amount of resulting undercut.

As shown in FIG. 12B, it is believed that in some cases the portion of anti-corrosive material 1246 adsorbed to the sidewall 1232 may exhibit a generally tapered shape, in which the adhered and/or adsorbed layer 1246 of the anti-corrosive material exhibits greater thickness proximate the anti-corrosive material layer 1229 and a reducing thickness along the layer 1246 in a direction away from the anti-corrosive material layer 1229 and toward the substrate.

Figure 13A:
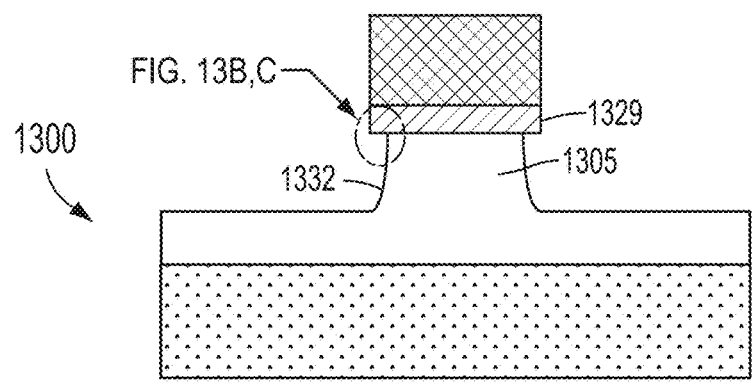
FIG. 13A is a cross-sectional view of a device during processing to form a patterned layer on a substrate according to another exemplary embodiment of the present disclosure.
Figure 13B:
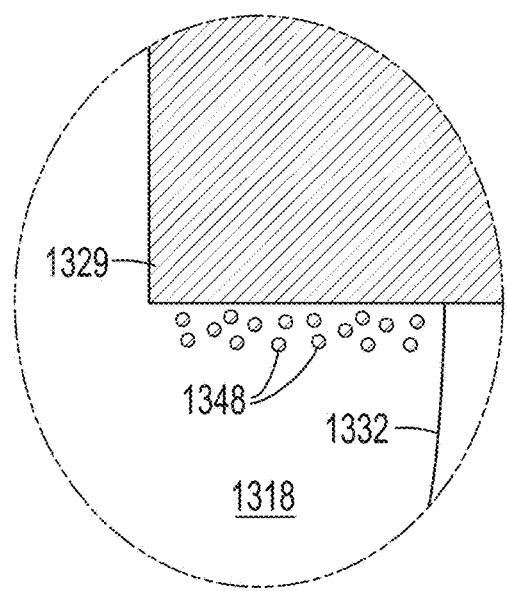
FIGS. 13B and 13C are enlarged views of the portion in circle 13B,C of FIG. 13A showing characterizations of different states in B and C.
Figure 13C:
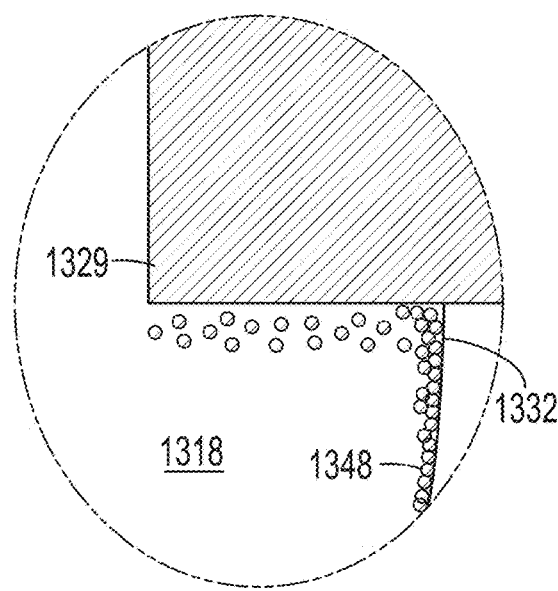

FIGS. 13A, 13B, and 13C show an additional example of a process in which it is believed that particles 1348 of an anti-corrosive material dissociate from anti-corrosive layer 1329 and adhere to and/or adsorb onto a sidewall 1332 of a partially patterned device layer 1305 of a device 1300. FIGS. 13B and 13C show enlarged views of an interface between an anti-corrosive material layer 1329 and the partially patterned device layer sidewall 1332. As shown in FIG. 13B, particles 1348 of the anti-corrosive material dissociate from the anti-corrosive material layer 1306. In FIG. 13C, the dissociated particles 1348 adhere to and/or adsorb onto the sidewall 1332 of the partially patterned device layer 1305. The dissociated particles 1348 may adhere to and/or adsorb onto the sidewall 1332 in a pattern that generally decreases in thickness in a direction away from the anti-corrosive material layer 1329. It is believed that in various cases, the dissociated particles 1348 may adsorb onto and/or adhere to the sidewall 1332 in a substantially even pattern, a substantially random pattern, or in some other pattern. The presence of the particles 1348 on the sidewall 1332 may inhibit the action of an etchant 1318 and mitigate (e.g., reduce or eliminate) the undercut that occurs on the partially patterned device layer 1305 during the etching process. As described above with respect to FIG. 12, in various exemplary embodiments, it is believed that at least two processes contribute to these phenomena, wherein in one process the anti-corrosive material is dissolved by the etchant and in another, simultaneous process, the anti-corrosive material dissolved in the etchant is adsorbing onto and/or adhering to the sidewall 1332, and in various embodiments the rates of the first and the second process are such that anti-corrosive material portion 1346 is formed and maintained during the etching process so as to decrease (e.g. reduce or eliminate) the amount of undercut observed.

Figure 14:
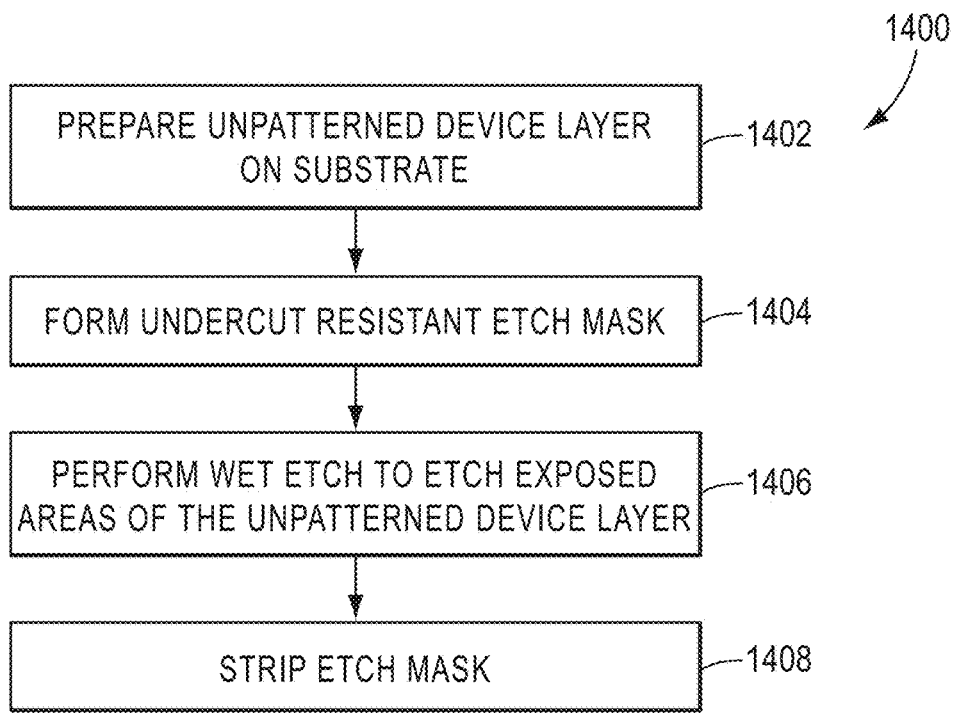
FIG. 14 is a flow chart showing a work flow for forming a patterned layer on a substrate according to an exemplary embodiment of the disclosure.

FIG. 14 is a flow chart showing an exemplary embodiment of a work flow 1400 for forming a device, for example and without limitation, an electrical or optical component or device, according to the disclosure. At 1402, an unpatterned device layer is prepared on a substrate. For example, an unpatterned device layer, for example a conductive film, is laminated or otherwise deposited onto an electrically insulating surface of a substrate. At 1404, an undercut-resistant etch mask is formed, such as by depositing an anti-corrosive layer on the unpatterned device layer and depositing an etch mask over the anti-corrosive material. For example, a liquid primer ink containing an anti-corrosive material is blanket coated onto the substrate and then dried to form an anti-corrosive primer layer, and a liquid etch mask ink is printed onto the anti-corrosive primer layer and then dried to form an etch mask. Together, the primer layer and the etch mask form the undercut-resistant etch mask. The undercut-resistant etch mask may comprise an anti-corrosive layer as discussed in the exemplary embodiments above (such as, for example, anti-corrosive layers 629, 729, 829, 929, 1129 1229, or 1329) and an etch mask (such as, for example, etch masks 628, 728, 828, or 928). The primer layer and the liquid etch mask ink may interact to form a bi-component material, as described above. The primer layer and the liquid etch mask ink may interact so as to effectively immobilize or freeze the ink on the primer surface, as described above. At 1406, a wet etch is performed to remove areas of the unpatterned device layer not covered by the etch mask (i.e., exposed portions of the unpatterned device layer). The wet etch can be performed for a duration sufficient to remove the exposed portions of the unpatterned device layer, thereby leaving a patterned device layer corresponding to features covered by the etch mask. At 1408, the etch mask is stripped away, such as by immersing the device in or spraying the device with a stream of stripping fluid that is designed to dissolve and thereby remove the etch mask to expose resulting patterned device layers on the device. In various further embodiments, the stripping process also removes the anti-corrosive layer under the etch mask.

Figure 15:
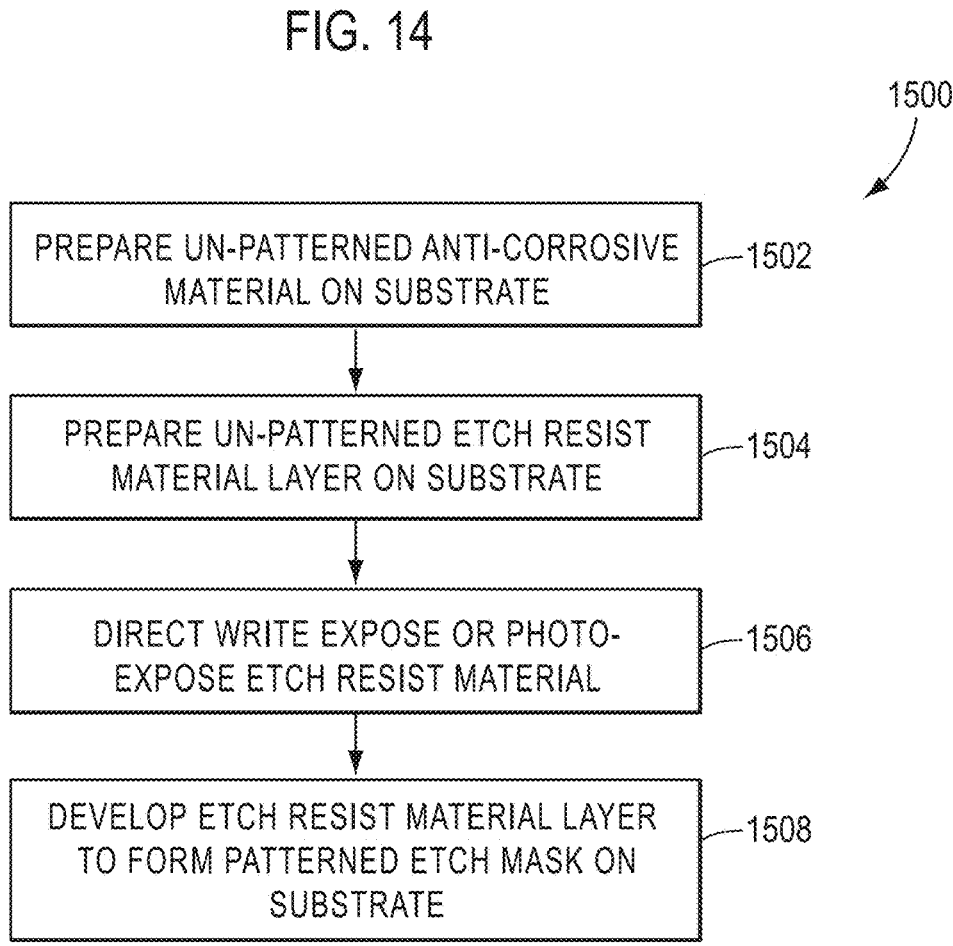
FIG. 15 is a flow chart showing a work flow for forming a patterned layer on a substrate according to another exemplary embodiment of the disclosure.

FIG. 15 is a flow chart showing in greater detail an exemplary embodiment of a work flow 1500 for forming an undercut-resistant etch mask, such as that discussed in connection with 1404 above, on a substrate according to the disclosure. At 1502, an anti-corrosive layer, such as, for example, anti-corrosive layer 629, 729, 829, 929, 1129 1229, or 1329, is formed on a substrate with an unpatterned device layer. In the embodiment of FIG. 15, the anti-corrosive layer is formed as a blanket coating (i.e., an unpatterned layer) over the entire surface of the unpatterned device layer. At 1504, an etch mask, such as etch mask 628, 728, 828, or 928 is formed over the surface of the anti-corrosive layer in a blanket coating. At 1506, the etch-resist material is direct write exposed or photo-exposed, such as by exposing to a pattern of UV light as generally discussed above in connection with FIGS. 2A-2C. At 1508, the etch-resist material is developed to form the patterned etch mask, such as, for example, by removing the etch-resist material not exposed to the UV light (in the case of a negative tone process) or exposed to the UV light (in the case of a positive tone process.)

Figure 16:
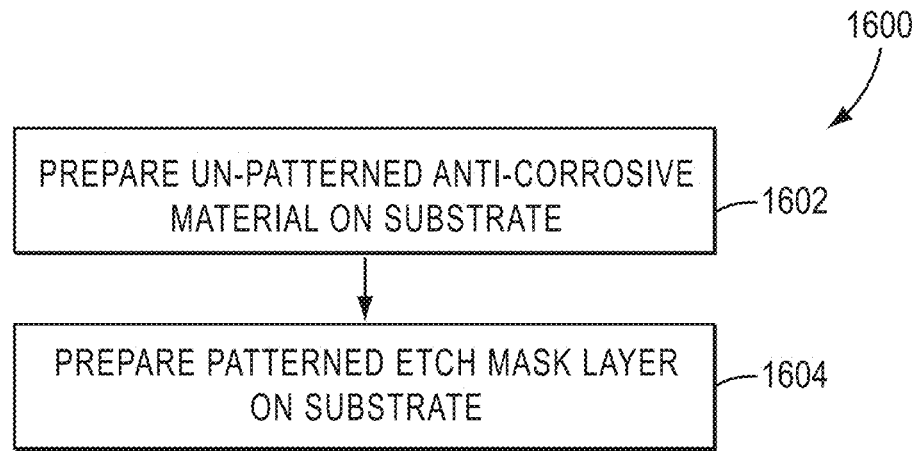
FIG. 16 is a flow chart showing a work flow for forming a patterned layer on a substrate according to another exemplary embodiment of the disclosure.

FIG. 16 is a flow chart showing another exemplary embodiment of a work flow 1600 for forming an undercut resistant etch mask on a substrate according to the disclosure. At 1602, an anti-corrosive layer, (such as, for example, anti-corrosive layers 629, 729, 829, 929, 1129 1229, or 1329) is formed over a substrate with an unpatterned device layer in a blanket coating over the unpatterned device layer. At 1604, a patterned etch mask (such as, for example, etch masks 628, 728, 828, or 928) is prepared over the un-patterned anti-corrosive coating.

Figure 17:
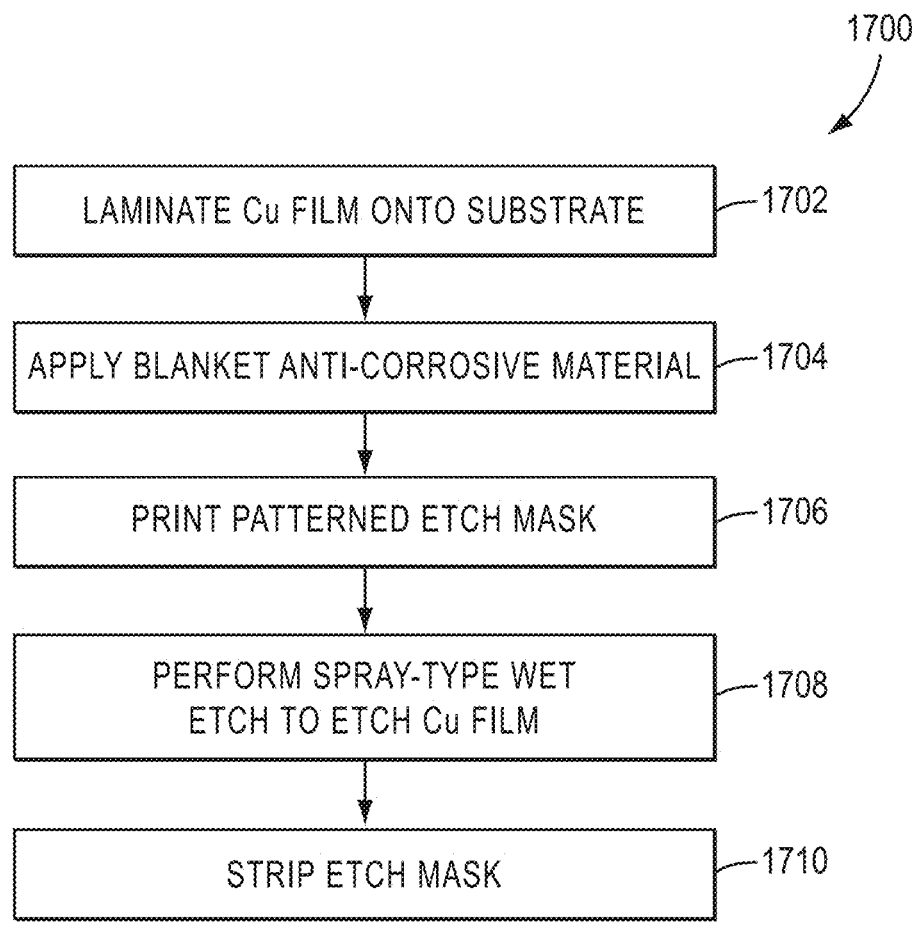
FIG. 17 is a flow chart showing a work flow for forming a patterned copper layer on a substrate, as, for example, in the manufacture of a PCB, according to another exemplary embodiment of the disclosure.

FIG. 17 is a flow chart showing another exemplary embodiment of a work flow 1700 of forming a device according to the disclosure. At 1702, an unpatterned device layer, such as for example but not limited to, a copper film is laminated onto an electrically insulating surface of a substrate. At 1704, an anti-corrosive layer (such as, for example, anti-corrosive layers 629, 729, 829, 929, 1129, 1229, or 1329) is formed in a blanket coating over the copper film. At 1706, an etch mask (such as, for example, etch resist mask 628, 728, 828, or 928) is prepared by printing a liquid etch-resist ink in desired pattern over the blanket-coated anti-corrosive material and then drying the liquid to form the etch mask. At 1708, a spray-type wet etch is performed to etch the areas of the copper film not covered by the etch mask material. At 1710, the etch mask is stripped from the remaining portions of copper film to expose the formed conductive features. In various embodiments, the anti-corrosive layer is a primer layer, and the liquid etch-resist ink may be applied to the surface in the form of droplets delivered by an inkjet nozzle, and upon contact with the primer surface, such droplets may be soon after (e.g., on the order of micro-seconds) immobilized or "frozen" in place, for example without limitation due to a chemical reaction triggered by the interaction between the etch-resist ink and the primer layer, such that further translation or spreading of the ink droplet on the primer surface is greatly reduced or stopped entirely, as described above and in International Publication Nos. WO2016/193978 A2 and WO2016/025949 A1. In various embodiments, the primer layer and the liquid etch mask ink interact to form a bi-component etch mask material.

Figure 18:
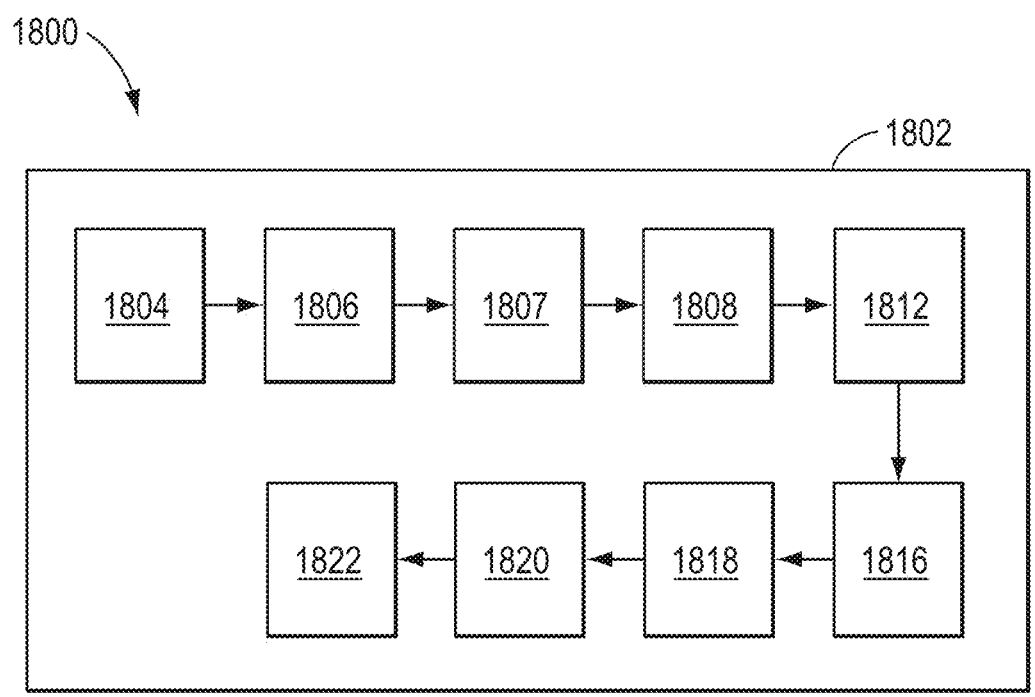
FIG. 18 is a block diagram of components of a system for forming a device according to various exemplary embodiments of the disclosure.

FIG. 18 shows a block diagram of an apparatus 1800 for producing devices according to embodiments of the disclosure. The apparatus 1800 may include an enclosure 1802. In various exemplary embodiments, the enclosure 1802 may be configured to provide ambient particle filtration, control of relative humidity, control of temperature, or other process condition controls within a processing environment. The apparatus 1800 may include a first substrate transporting mechanism 1804, and a substrate input unit 1806 configured to receive a substrate from the first substrate transporting mechanism 1804. The substrate may comprise an unpatterned device layer, such as substrates 602, 702, 802, or 902 and unpatterned device layers 604, 704, 804, or 904 discussed in connection with FIGS. 6A-9C. A first deposition module 1808 is configured to deposit a first layer, such as an anti-corrosive layer 629, 729, 829, 929, 1129, 1229, or 1329 discussed in connection with FIGS. 6A-9C and 11-13C, over the unpatterned device layer, wherein first deposition module 1808 may comprise a portion that deposits a first material onto the substrate and portion that further processes the deposited first material to as to from the anti-corrosive layer, for example without limitation, by drying, curing, or otherwise processing the first material. A second deposition module 1812 is configured to deposit an etch mask, such as etch mask 628, 728, 828, or 928 discussed in connection with FIGS. 6A-9D, over the anti-corrosive material layer. The second deposition module 1812 may comprise a portion that deposits a second material onto the substrate and a portion that further processes the deposited second material to as to from the etch mask, for example without limitation, by drying, curing, developing, photo-exposing, laser direct writing, or otherwise processing the second material. The apparatus 1800 may include a substrate output unit 1820 that provides the substrate to a second substrate transporting mechanism (not shown). The first substrate transporting mechanism 1804 may transport the substrate from a previous processing module or apparatus to the apparatus 1800, and the second substrate transporting mechanism may transport the substrate to a next processing module or apparatus.

In various exemplary embodiments, the first deposition module 1808 and the second deposition module 1812 may be configured to deposit materials by methods such as inkjet printing, spraying, laminating, spin coating, or any other method of deposition, including but not limited to any of the deposition methods described above.

In some exemplary embodiments, the apparatus comprises a substrate cleaning module 1807 configured to receive the substrate from the substrate input unit 1806, clean the substrate, and transfer the substrate to the first deposition module 1808. In some exemplary embodiments, the first deposition module 1808 and the second deposition module 1812 may be a single module. In some exemplary embodiments, the apparatus 1800 includes an etching module 1816 configured to etch the material in the unpatterned device layer not protected by the etch mask and a stripping module 1818 configured to remove the etchmask from the substrate following etching of the material of the unpatterned device layer on the substrate.

Figure 19:
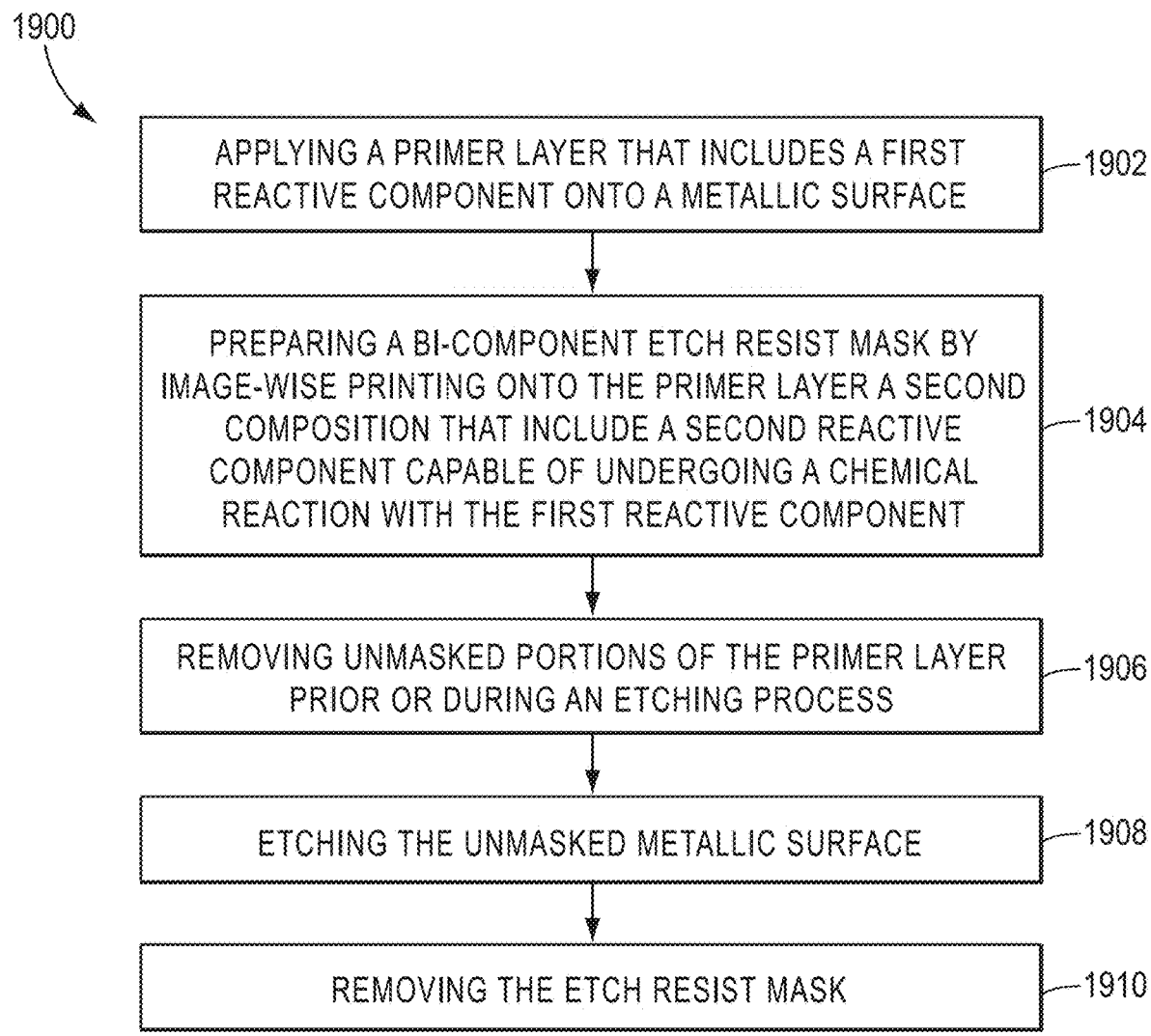
FIG. 19 is a flow chart showing a work flow for forming a patterned layer on a substrate according to another exemplary embodiment of the disclosure.

FIG. 19 shows an exemplary work flow 1900 according to another embodiment of the disclosure. At 1902, a primer layer including a first reactive component is applied onto an unpatterned device layer, such as a metallic surface, e.g., a copper foil. The primer layer may be an anti-corrosive layer such as anti-corrosive layers 629, 729, 829, 929, 1129, 1229, or 1329 associated with the embodiments above. At 1904, a bi-component etch resist mask is prepared by image-wise printing a liquid etchresist ink comprising a second composition including a second reactive component onto the primer layer. The bi-component material resulting from the interaction of the etch resist ink may comprise, for example, an etch mask such as 628, 728, 828, or 928 described in connection with the embodiments above. The second composition may include a second reactive component capable of undergoing a chemical reaction with the first reactive component. In various embodiments, the etch resist ink may be applied to the surface in the form of droplets delivered by an inkjet nozzle, and upon contact with the primer surface, such droplets may be soon after (e.g., on the order of micro-seconds) immobilized or "frozen" in place, for example without limitation due to a chemical reaction triggered by the interaction between the etch resist ink and the primer layer, such that further translation or spreading of the ink droplet on the primer surface is greatly reduced or stopped entirely, as described above and in International Publication Nos. WO2016/193978 A2 and WO2016/025949 A1. At 1906, unmasked portions of the primer layer (i.e., portions of the primer layer not covered by the etch mask) are removed before, or during, an etching process. At 1908, the unmasked portions of the metallic surface are etched to form a patterned device layer, such as the patterned device layer 630, 730, 830, 930, 1130, 1230, or 1330 discussed in connection with the embodiments above. At 1910, the etch resist mask is removed to expose the patterned device layer.

Examples 1-3

The following comparative examples were performed to demonstrate the reduction in undercutting obtained using embodiments of the present disclosure as compared to conventional processes not utilizing an anti-corrosive material.

In Examples 2 and 3 detailed below, a polyimine-based agent composition was first applied on top of an FR4 copper clad board having a copper thickness of ½ Oz (17 µm) using an Epson stylus 4900 inkjet printer. Then, an etch resist mask was applied on top of the polyimine layer. An aqueous etch resist composition was prepared using 10% propylene glycol as a humectant and 1% (w/w) 2-Amino-2-methyl propanol as an ion exchange, 0.3% (w/w) of BYK 348 supplied by BYK as a surfactant and 2% (w/w) of Bayscript BA Cyan as a colorant. The etch resist solution further included 24% Joncryl 8085 styrene acrylic resin solution as the anionic etch resist. In the description below, % (w/w) is a measure of the concentration of a substance in terms of the percentage by weight relative to the weight of the composition. The printed samples were dried at 80° C. Copper from the unprotected exposed zones was etched away using an etchant bath containing acidic etching solutions. The etch resist mask was stripped off by immersing the etched board in a 1% (w/w) NaOH in aqueous solution at a temperature of 25° C. followed by washing the FR4 copper board with water and drying it using air at 25° C. In Example 1, another sample was prepared without applying the underlying agent layer.

Example 1

Figure 20:
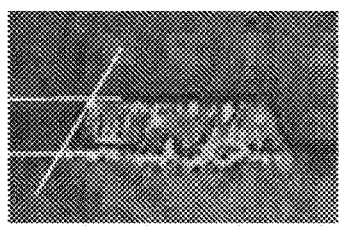
FIG. 20 is a photo micrograph of a conductive feature formed according to a conventional process.

An etch resist pattern was printed on top of an uncoated copper FR4 board at a copper thickness of 2 Oz (17 µm) using an Epson stylus 4900 inkjet printer. Reference is made to FIG. 20, which shows a micrograph of a cross section of the copper wire sample made according to Example 1. An aqueous etch resist composition was prepared using 10% propylene glycol as a humectant and 1% (w/w) 2-Amino-2-methyl propanol as an ion exchange, 0.3% (w/w) of BYK 348 supplied by BYK as a surfactant and 2% (w/w) of Bayscript BA Cyan as a colorant. The etch resist solution further included 24% Joncryl 8085 styrene acrylic resin solution as the anionic etch resist reactive component. The drying, etching and removal of the etch resist was conducted as described above. As can be seen from FIG. 20, the slope of the copper sidewalls is relatively high. Relevant dimensions of the formed conductive feature were measured and the etch factor was calculated to be 1.5.

Example 2

An etch resist pattern was printed on top of a copper FR4 board coated with a polyimine-based coating. A polyimines aqueous solution was prepared as a mixture of 10% (w/w) LUPASOL G100 (polyethyleneimine having molecular weight of 5000) in aqueous solution supplied by BASF, 10% (w/w) propylene glycol, 10% n-Propanol and 0.3% (w/w) containing TEGO 500 supplied by Evonik Industries. The poly-imines solution was applied using Epson stylus 4900 inkjet printer. The polyimine-based coating was left to dry at a room temperature resulting in a fully transparent uniform coating having a dry thickness of 0.075 µm covering the entire surface of the board without crystal formation. The etch resist composition was printed on the coated copper board using the process and materials as detailed above. Relevant dimensions of the formed conductive feature were measured and the etch factor was calculated to be 2.5.

Example 3

Figure 21:
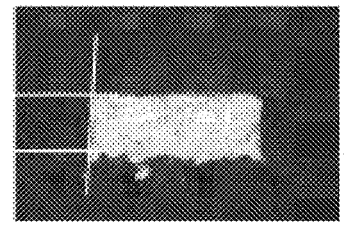
FIG. 21 is a photo micrograph of a conductive feature formed according to an exemplary embodiment of the present disclosure.

An etch resist pattern was printed on top of a copper FR4 board coated with a polyimine-based coating. Reference is made to FIG. 21, which shows a micrograph of a cross section of a copper wire the copper wire sample made according to Example 3, according to embodiments of the disclosure. A polyimine-based coating was coated on top of FR4 board using Epson stylus 4900 inkjet printer. The polyimine solution was prepared as a mixture of an aqueous solution of 10% (w/w) LUPASOL HF (polyethyleneimine having a molecular weight of 25,000) supplied by BASF, 10% (w/w) propylene glycol, 10% n-Propanol and 0.3% (w/w) containing TEGO 500 supplied by Evonik Industries. The coated plate was left to dry at room temperature resulting in a fully transparent uniform coating having a thickness of 0.075 µm dry layer covering the entire surface without crystal formation.

An etch resist composition was prepared as detailed in Example 1. The etching of the unmasked copper and the removal of the etch resist mask were conducted as described with respect to Example 1. As shown in FIG. 21, the slope of the sidewalls of the copper wire is much smaller than the sample prepared without the undercut eliminating layer as shown in FIG. 20. Relevant dimensions of the formed conductive feature were measured and the etch factor was measured and found to be 7.5.

Table 1 below summarizes some characteristics of the results of the three Examples.

TABLE 1

| Example | undercut prevention Agent | MW | W2-W1 | X | Height—H | Etch Factor |
|---|---|---|---|---|---|---|
| 1 | None | — | 20 | 10 | 15 | 1.5 |
| 2 | Lupasol G100 | 5000 | 12 | 6 | 15 | 2.5 |
| 3 | Lupasol HF | 25,000 | 4 | 2 | 15 | 7.5 |

The following comparative examples were performed to demonstrate the improvement in formation of an etch mask using a primer layer and an inkjet printed etch resist ink, wherein upon contact with the primer layer, one or more reactions occur between components of the primer layer and the etch resist ink so that a bi-component etch mask material is formed and droplets of the etch resist ink are rapidly (e.g., on the order of micro-seconds) immobilized or frozen and subsequent spreading and/or translation of such droplets is greatly reduced.

Examples 4-12

Using an Epson stylus 4900 inkjet printer exemplary etch resist compositions (second composition as described in here) were printed on an FR4 copper clad boards having a thickness of ½ Oz, ⅓ Oz and 1 Oz. In some cases, the copper was first coated using an Epson stylus 4900 inkjet printer with a fixating composition (first composition as described in here) forming a fixating layer on which the etch resist compositions were selectively printed according to a predetermined pattern. In the description below, % (w/w) is a measure of the concentration of a substance in terms of the percentage by weight relative to the weight of the composition. Copper from the unprotected by the etch resist— exposed zones was etched away using an etchant bath containing a ferric chloride etchant solution of strength 42° Baume supplied by Amza [pemix 166]. The etching was performed in a Spray Developer S31, supplied by Walter Lemmen GMBH, at a temperature of 35° C. for 3 minutes. The etch resist mask was stripped off by immersing the etched board in a 1% (w/w) NaOH in aqueous solution at a temperature of 25° C. followed by washing the FR4 copper board with water and drying by air at 25° C. The copper boards were also etched, in some experiments, using an industrial etching unit including hyper and super etching units, manufacture by Universal or Shmidth containing Copper chloride solution for etching non-protected copper.

Example 4

An etch resist composition printed on top of an uncoated copper FR4 board (comparative data). An etch resist composition (second composition) was prepared with 10% propylene glycol and 1% (w/w) 2-Amino-2-methyl propanol, 0.3% (w/w) of BYK 348 supplied by BYK and 2% (w/w) of Bayscript BA Cyan. These materials were dissolved in water containing 24% Joncryl 8085 styrene acrylic resin solution as the anionic reactive component. Using an Epson stylus 4900 inkjet printer the etch resist composition was printed on an FR4 copper clad board having a thickness of ½ Oz to produce the etch resist mask. The dry etch resist thickness was 5 microns.

The etch mask was visually inspected, and the printed pattern demonstrated a very poor print quality with extremely poor edge definition, line breaks and severe shorts between the lines.

Example 5

The etch resist composition was prepared as detailed in Example 4. A primer or fixating composition was prepared as a mixture of an aqueous solution of 10% (w/w) LUPASOL PR8515 supplied by BASF (Polyethylenimine as the cationic reactive component), 10% (w/w) Propylene glycol, 10% n-Propanol and 0.3% (w/w) containing TEGO 500 supplied by Evonik Industries (a foam-inhibiting substrate wetting additive).

An FR4 Copper board was coated using Epson stylus 4900 inkjet printer. The coated plate was left to dry at room temperature resulting in a fully transparent uniform coating having a thickness of 0.3 dry layer covering the entire surface without any crystal formation. Using an Epson stylus 4900 inkjet printer, the etch resist composition was printed on the coated copper board and dried at 80° C. to produce a bi-component etch resist mask. The etch mask was visually inspected to show a better print quality than Example 4 but still a relatively poor print quality with broadens lines and shorts between lines. The etching of the unmasked copper and removal of the etch resist mask were conducted as detailed in example 4. The wiring pattern produced after the etching process had an identical image as the etch resist mask with the same broaden lines and shorts between lines. It should be noted that for certain applications the print quality as exhibited by Example 5 may be sufficient.

Example 6

The etch resist composition was prepared as detailed in Example 4. The fixating composition was prepared as detailed in Example 5 with the exception of replacing 0.3% (w/w) TEGO 500 with 0.3% (w/w) TEGO 500 containing 13% (w/w) concentrate HCl.

An FR4 Copper board was coated with the fixation composition using Epson stylus 4900 inkjet printer as detailed in Example 5 and after drying a coating layer as detailed in Example 5 was formed. Similarly to Example 5, the etch resist composition was inkjet-printed on the coated copper board and dried at 80° C. to produce a bi-component etch resist mask. The etch resist pattern demonstrated a high print quality with well-defined thin lines having a thickness of down to 2 millimeters, sharp edges and no line breaks. The etching of the unmasked copper and removal of the etch resist mask were conducted as detailed in example 4. The wiring pattern produced by the etching and stripping processes demonstrated a well-defined pattern with thin lines having a width of down to 15 microns sharp edges and no line breaks.

Example 7

Bi-component reaction, an etch resist composition printed on a copper surface coated with a reactive cationic composition containing Hydrochloric acid (HCl). The etch resist composition was prepared as detailed in Example 4. A fixating composition was prepared as a mixture of an aqueous solution of 10% (w/w) Styleze W-20 (supplied by ISP as a 20% polymer in aqueous solution), 0.1% of BYK 348, and 13% (w/w) concentrate HCl.

An F4F copper board was covered using a Mayer rod with the fixating composition to produce a dry layer having a thickness of 0.4. The coated board was left to dry, resulting in a fully transparent coating over the entire copper surface with no crystal formation. Similarly to Example 5, the etch resist composition was inkjet-printed on the coated copper board and dried at 80° C. to produce a bi-component etch resist mask.

The etch resist pattern demonstrated a high print quality with well-defined and thin lines down to 2 millimeters with sharp edges and no line breaks. Residue of the fixating layer that was not covered by the etch resist composition was washed by socking the board in water for 2 minutes at temperature of 25° C. and dried at 80° C. Etching of the exposed copper and removal of the etch resist mask were conducted as detailed in Example 4. The wiring pattern on the board demonstrated well-defined thin lines with a width down to 2 mil containing sharp edges and no line breaks.

Example 8

Bi-component reaction, an etch resist composition printed on a copper surface coated with a reactive cationic composition containing Hydrochloric acid (HCl). The etch resist composition was prepared as detailed in Example 4. A fixating composition was prepared as a mixture of an aqueous solution of 10% (w/w) Lupasol HF (supplied by BASF as a 56% polymer in aqueous solution), 0.1% of BYK 348 containing 13% (w/w) concentrate HCl.

An FR4 copper board was covered using a Mayer rod with the fixating composition to produce a dry layer having a thickness of 1. The coated board was left to dry, resulting in a fully transparent coating over the entire copper surface with no crystal formation. Similarly to Example 5, the etch resist composition was inkjet-printed on the coated copper board and dried at 80° C. to produce a bi-component etch resist mask.

The etch resist pattern demonstrated a high print quality with well-defined and thin lines down to 2 mil contained sharp edges and no line breaks. Residue of the fixating layer not covered by the etch resist composition was washed by socking the board in water for 3 minutes at temperature of 25° C. and dried at 80° C. Etching of the exposed copper and removal of the etch resist mask were conducted as detailed in Example 4. The wiring pattern on the board demonstrated well-defined thin lines with a width down to 2 mil containing sharp edges and no line breaks.

Example 9

Bi-component reaction: an etch resist composition printed on a copper surface coated with a reactive cationic composition containing Hydrochloric acid (HCl). The etch resist composition was prepared as detailed in Example 5. A fixating composition was prepared as a mixture of an aqueous solution of 10% (w/w) Lupasol PN 50 (supplied by BASF as a 49% polymer in aqueous solution), 0.1% of BYK 348 containing 13% (w/w) concentrated HCl.

An FR4 copper board was covered using a Mayer rod with the fixating composition to produce a dry layer having a thickness of 1. The coated board was left to dry, resulting in a fully transparent coating over the entire copper surface with no crystal formation. Similarly to Example 5, the etch resist composition was inkjet-printed on the coated copper board and dried at 80° C. to produce a bi-component etch resist mask.

The etch resist pattern demonstrated a high print quality with well-defined and thin lines down to 2 millimeters containing sharp edges and no line breaks. Residue of the fixating layer was washed as detailed in Example 8. Etching of the exposed copper and removal of the etch resist mask were conducted as detailed in Example 1. The wiring pattern on the board demonstrated well-defined thin lines with a width down to 2 mil containing sharp edges and no line breaks.

Example 10

Bi-component reaction, an etch resist composition printed on a copper surface coated with a reactive composition containing citric acid. The etch resist composition was prepared as detailed in Example 4. A fixating composition was prepared as a mixture of an aqueous solution of 10% (w/w) citric acid, 25% (w/w) Propylene glycol, containing 0.3% (w/w) TEGO 500 supplied by Evonik Industries (a foam inhibiting substrate wetting additive).

An FR4 Copper board was coated with the fixating composition using an Epson stylus 4900 inkjet printer. The coated plate was left to dry at room temperature resulting in a fully transparent uniform coating having a thickness of 0.3μ dry layer covering the entire surface without crystal formation. Similarly to Example 5, the etch resist composition was inkjet-printed on the coated copper board and dried at 80° C. to produce a bi-component etch resist mask.

The etch resist pattern demonstrated a high print quality with well-defined and thin lines down to 2 mil containing sharp edges and no line breaks. Etching of the exposed copper and removal of the etch resist mask were conducted as detailed in Example 4. The wiring pattern on the board demonstrated well-defined thin lines with a width down to 2 mil containing sharp edges and no line breaks.

Example 11

Bi-component reaction, coating composition containing the etch resist composition was prepared as detailed in Example 4. A fixating composition was prepared as a mixture of an aqueous solution of 2.5% (w/w) $Zn(NO_3)_2$, 3.75% (w/w) Calcium acetate, 0.2% (w/w) Capstone 51, 5% (w/w) n-Propanol and 5% (w/w) Lupasol FG (supplied by BASF).

An FR4 copper board was covered using a Mayer rod with the fixating composition to produce a dry layer having a thickness of 0.5. The coated board was left to dry, resulting in a fully transparent coating over the entire copper surface with no crystal formation. Similarly to Example 5, the etch resist composition was inkjet-printed on the coated copper board and dried at 80° C. to produce a bi-component etch resist mask.

Similarly to Example 5, the etch resist composition was inkjet-printed on the coated copper board and dried at 80° C. to produce a bi-component etch resist mask.

The etch resist pattern demonstrated a high print quality with well-defined and thin lines down to 2 mil containing sharp edges and no line breaks. Etching of the exposed copper and removal of the etch resist mask were conducted as detailed in Example 4. The wiring pattern on the board demonstrated well-defined thin lines with a width down to 2 mil containing sharp edges and no line breaks.

Example 12

A etch-resist composition was prepared as a mixture of an aqueous solution of 8% (w/w) PVA, 24% Joncryl 8085 styrene acrylic resin solution (supplied as a 42% polymer in aqueous solution) and 1.5% of 2-Amino 2-methyl propanol.

A fixating composition was prepared as follows: 2% (w/w) of Basacid Red 495, 10% (w/w) Propylene glycol, 10% n-Propanol, 0.3% (w/w) TEG0500, 10% (w/w) Lupasol G20 (supplied by BASF) containing 12% (w/w) HCl concentrated. An FR4 copper board was covered using a Mayer rod with the etch-resist composition to produce a dry layer having a thickness of 2.4μ. The coated board was left to dry, resulting in a fully transparent coating over the entire copper surface with no crystal formation. The fixating composition was inkjet-printed on the coated copper board and dried at 80° C. to produce a bi-component etch resist mask.

Similarly to Example 5, the etch resist composition was inkjet-printed on the coated copper board and dried at 80° C. to produce a bi-component etch resist mask.

The etch resist pattern demonstrated a high print quality with well-defined and thin lines down to 2 mil containing sharp edges and no line breaks. Residue of the coating which was not coved by the etch resist ink was washed by socking the board in aqueous solution of 1% (w/w) $NaHCO_3$ for 30 seconds at temperature of 25° C. and dried at 80° C. Etching of the exposed copper and removal of the etch resist mask were conducted as detailed in Example 4. The wiring pattern on the board demonstrated well-defined thin lines with a width down to 2 mil containing sharp edges and no line breaks.

Cationic Compositions (Fixating Reactive Component)

Non-limiting examples of cationic reactive component (a fixating reactive component) may include polyamides, for example, Polyethyleneimine, divalent metal salts, acids both organic or inorganic, Heteropolymer of vinyl pyrolidon, dimethylaminopropyl methacrylamide; methacryloylaminopropy lauryl dimethyl ammonium chloride, Poly-quaternary amines and polyamines in natural form or as ammonium salts.

The thickness of a dried fixating layer may be as thin as around 0.01 microns. A typical desired thickness for a dry layer may vary between 0.025 and 5 microns.

The cationic composition (first composition) may include additional components adapted to suit the method of application and the desired width of the dried layer. The composition may have a viscosity suitable for spraying or ink-jet printing, for example, a viscosity of less than 60 centipoise or between 3-20 cP (centipoise) at an ambient temperature, respectively. The composition might have higher viscosity in case a different coating method is applied.

In some embodiments, an acidic solution may be added to the first solution in order to increase reactivity of first layer to the copper layer 320 as well as its reactivity to the etch resist or fixating layer. In some embodiments, the first layer may further be developed, for example, by water, prior to the copper etch process. In some embodiments, the applied first layer may be dried prior to the application of the second layer. The as-dried layer may contain mainly the first reactive material. The first layer may be dried using any known drying method.

Some non-limiting examples of first reactive components (e.g., a fixating component) and first compositions (e.g., fixating composition, cationic composition) are listed in Table 1.

TABLE 1

| | Fixating Composition | Reactive component chemical group |
|---|---|---|
| 1 | Aqueous solution of 10% (w/w) Polyethyleneimine, 10% (w/w) Propylene glycol, | Polyethyleneimine, 10% (w/w) Molecular |

TABLE 1-continued

| | Fixating Composition | Reactive component chemical group |
|---|---|---|
| | 10% n-Propanol, 0.3% (w/w) containing surfactants | weight (Mw) 500-5000 |
| 2 | Aqueous solution of 10% (w/w) Polyethyleneimine Propylene glycol, 10% n-Propanol, 0.3% (w/w) containing surfactants | Polyethyleneimine, 10% (w/w) Mw 6000-2000000 |
| 3 | Aqueous solution of 10% (w/w) Heteropolymer of VP, 10% (w/w) Propylene glycol, 10% n-Propanol, 0.3% (w/w) containing surfactants | Heteropolymer of vinylpyrolydon, dimethylaminopropyl methacrylamide & methacryloylaminopropy lauryl dimethyl ammonium chloride |
| 4 | Aqueous solution of 10% (w/w) Poly-quaternary amine, 10% (w/w) Propylene glycol, 10% n-Propanol, 0.3% (w/w) containing surfactants | Poly-quaternary amines |
| 5 | Aqueous solution of 3% (w/w) Polyethyleneimine, 5% metal salts, 10% (w/w) Propylene glycol, 10% n-Propanol, 0.3% (w/w) containing surfactants | Polyethyleneimine (Mw 500-5000) contains divalent metal salts (e.g., Ca, Zn, Mg, etc.) |
| 6 | Aqueous solution of 3% (w/w) Polyethyleneimine, 5% metal salts, 10% (w/w) Propylene glycol, 10% n-Propanol, 0.3% (w/w) containing surfactants | Polyethyleneimine (Mw 600-2000000 contains divalent metal salts (Ca, Zn, Mg, etc.) |

Anionic Compositions (Etch Resist Polymeric Component)

In some embodiments, the second reactive component (e.g., a polymeric component) may be an etch-resistant component (resistant to the metallic etching solution). The second reactive component may include polyanion active groups such as: acrylates, styrene acrylates; phosphates and sulfonates. A droplet of the etch-resist ink applied on top of the first (e.g., fixating) layer can be immobilized and fixated to the copper surface due to a chemical reaction between the first reactive material (that includes poly-cations) and the second reactive material (that includes poly-anions). Since the fixation is very rapid (in the micro-second range) the dimension of the printed pattern is similar to the dimension of the required pattern. The compound formed by the reaction of first reactive material and the second reactive material (both of which are soluble in water) should be insoluble in copper etch solution.

The second composition may have a viscosity suitable for inkjet printing of less than 60 cP, for example, 3-20 cP at the jetting temperature. The composition might have higher viscosity in case a different coating method is applied. In some embodiments, the second composition may include no more than 20% (w/w) of the reactive component to sustain the required viscosity. In some embodiments, the polyanion reactive component (the etch-resist polymer) when dissolved in composition may have a maximal of 5000 molar weight (e.g., the polymer may have relatively short chains). In some embodiments, the etch-resist polymer may have higher molar weight resulting in a composition in a form of polymeric emulsion or dispersion. The second reactive component may have high acidic value, for example, having more than 100 reactive anionic groups per gram of polymer. For example, an etch-resist polymer according to embodiments of the invention may have more than 200, 240, 300 or more reactive anionic groups in each chain.

Some non-limiting examples of the second reactive components (etch resistant components) and second compositions (etching resistant compositions, anionic compositions) are listed in Table 2.

TABLE 2

| No. | etching resistant composition | Second reactive component |
|---|---|---|
| 1 | 2% (w/w) of Cyan dye, 10% propylene glycol, 1% (w/w) 2-Amino-2-methyl propanol and 0.3% (w/w) of surfactant were dissolved in water containing 24% styrene acrylic resin solution. | acrylates Mw 800-17,000 Acid No 130-240 in Solution or emulsion |
| 2 | 2% (w/w) of Cyan dye, 10% propylene glycol, 1% (w/w) 2-Amino-2-methyl propanol and 0.3% (w/w) of surfactant were dissolved in water containing 24% phosphates resin solution. | Organo-phosphates Mw 800-17,000 Acid No 130-240 In Solution or Emulsion |
| 3 | 2% (w/w) of Cyan dye, 10% propylene glycol, 1% (w/w) 2-Amino-2-methyl propanol and 0.3% (w/w) of surfactant were dissolved in water containing 24% sulfonates resin solution. | Organo-Sulfonates Mw 800-17,000 Acid No 130-240 In Solution or emulsion |

This description and the accompanying drawings that illustrate exemplary embodiments should not be taken as limiting. Various mechanical, compositional, structural, and operational changes may be made without departing from the scope of this description and the claims, including equivalents. In some instances, well-known structures and techniques have not been shown or described in detail so as not to obscure the disclosure. Like numbers in two or more figures represent the same or similar elements. Furthermore, elements and their associated features that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

For the purposes of this specification and appended claims, unless otherwise indicated, all numbers expressing quantities, percentages, or proportions, and other numerical values used in the specification and claims, are to be understood as being modified in all instances by the term "about," to the extent they are not already so modified. Accordingly, unless indicated to the contrary, the numerical parameters set forth in the following specification and attached claims are approximations that may vary depending upon the desired properties sought to be obtained. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," and any singular use of any word, include plural referents unless expressly and unequivocally limited to one referent. As used herein, the term "include" and its grammatical variants are intended to be non-limiting, such that recitation of items in a list is not to the exclusion of other like items that can be substituted or added to the listed items.

Further, this description's terminology is not intended to limit the disclosure. For example, spatially relative terms—such as "beneath", "below", "lower", "above", "upper", "proximate", and the like—may be used to describe one element's or feature's relationship to another element or feature as illustrated in the figures. These spatially relative terms are intended to encompass different positions (i.e., locations) and orientations (i.e., rotational placements) of a device in use or operation in addition to the position and orientation shown in the figures. For example, if a device in the figures is turned over, elements described as "below" or "beneath" other elements or features would then be "above" or "over" the other elements or features. Thus, the exemplary term "below" can encompass both positions and orientations of above and below. A device may be otherwise oriented (rotated 90 degrees or at other orientations) and the spatially relative descriptors used herein interpreted accordingly.

Further modifications and alternative embodiments will be apparent to those of ordinary skill in the art in view of the disclosure herein. For example, the devices and methods may include additional components or steps that were omitted from the diagrams and description for clarity of operation. Accordingly, this description is to be construed as illustrative only and is for the purpose of teaching those skilled in the art the general manner of carrying out the present teachings. It is to be understood that the various embodiments shown and described herein are to be taken as exemplary. Elements and materials, and arrangements of those elements and materials, may be substituted for those illustrated and described herein, parts and steps in workflows and processes may be in alternate order, and certain features of the present teachings may be utilized independently, all as would be apparent to one skilled in the art after having the benefit of the description herein. Changes may be made in the elements described herein without departing from the spirit and scope of the present teachings and following claims.

Although various exemplary embodiments herein describe manufacture of a PCB, those having ordinary skill in the art would appreciate that other electrical and optical devices or components that are made using similar etching and metal or conductive line patterning techniques are encompassed within the scope of the disclosure and claims, and PCBs are discussed as one non-limiting, exemplary application. Other devices and components that may be manufactured according to exemplary embodiments herein include, but are not limited to, microchips, electronic displays, microchips, solar cells, and other electronic, optical, or other devices and components.

It is to be understood that the particular examples and embodiments set forth herein are non-limiting, and modifications to structure, dimensions, materials, and methodologies may be made without departing from the scope of the present teachings. Other embodiments in accordance with the present disclosure will be apparent to those skilled in the art from consideration of the specification and practice of the present disclosure. It is intended that the specification and examples be considered as exemplary only, with the following claims being entitled to their fullest breadth, including equivalents, under the applicable law.

What is claimed is:

1. A method of making a device patterned with one or more electrically conductive features, the method comprising:

depositing a conductive material layer over an electrically insulating surface of a substrate;

depositing a primer layer in a pattern over the conductive material layer;

depositing an etch-resist material layer over the primer layer;

reacting the primer layer and the etch-resist material layer to form a bi-component etch mask in the pattern resulting in covered portions of the conductive material layer and exposed portions of the conductive material layer;

performing a wet-etch process to remove the exposed portions of the conductive material layer from the electrically insulating surface;

protecting a portion of the conductive material layer from being removed during the wet-etch process, the portion being located at a sidewall of the conductive material layer under the bi-component etch mask; and removing the bi-component etch mask to expose conductive material remaining from the covered portions of the conductive material layer, thereby forming the one or more electrically conductive features of the device.

2. The method of claim 1, wherein depositing the primer layer over the conductive material layer comprises depositing a polymer over the conductive material layer.

3. The method of claim 1, wherein depositing the primer layer over the conductive material layer comprises depositing an organic material over the conductive material layer.

4. The method of claim 3, wherein the organic material is chosen from a material comprising one or more -imine groups, a material comprising one or more -amine groups, a material comprising one or more -azole groups, and a material comprising one or more hydrazine groups.

5. The method of claim 3, wherein the organic material comprises an amino acid.

6. The method of claim 1, further comprising irradiating portions of the etch-resist material layer with light, the irradiated portions corresponding locations of the one or more electrically conductive features.

7. The method of claim 6, wherein irradiating portions of the etch-resist material with light comprises using at least one of laser direct writing or photomask exposure.

8. The method of claim 1, wherein depositing the etch-resist material layer comprises depositing the etch-resist material layer using at least one of inkjet printing, slot die coating, spin coating, or lamination.

9. The method of claim 1, wherein depositing the primer layer comprises depositing the primer layer using at least one of inkjet printing, slot die coating, spin coating, or lamination.

10. The method of claim 1, wherein the etch-resist material layer is deposited so as to have a thickness of less than or equal to 15 µm.

11. The method of claim 1, wherein the etch-resist material layer is deposited so as to have a thickness of less than or equal to 5 µm.

12. The method of claim 1, wherein, in a dried state, a thickness of the primer layer ranges from 0.01 µm to 5 µm.

13. The method of claim 1, wherein the conductive material layer comprises a metal.

14. The method of claim 1, wherein the conductive material layer comprises copper.

15. A method of making a device patterned with one or more electrically conductive features, the method comprising:

depositing a conductive material layer over an electrically insulating surface of a substrate;

depositing a primer layer in a pattern over the conductive material layer;

depositing an etch-resist material layer over the primer layer, the etch-resist material layer and the primer layer forming a bi-component etch mask in the pattern resulting in covered portions of the conductive material layer and exposed portions of the conductive material layer;

performing a wet-etch process to remove the exposed portions of the conductive material layer from the electrically insulating surface;

protecting a portion of the conductive material layer from being removed during the wet-etch process, the portion being located at a sidewall of the conductive material layer under the bi-component etch mask; and removing the bi-component etch mask to expose conductive material remaining from the covered portions of the conductive material layer, thereby forming the one or more electrically conductive features of the device, wherein protecting the portion of the conductive material layer from being removed comprises dissociating material exhibiting an anti-corrosive property from the bi-component etch mask and adsorbing the dissociated material to the portion of the conductive material layer at the sidewall under the bi-component etch mask.

16. A method of making a device patterned with one or more electrically conductive features, the method comprising:

depositing a conductive material layer over an electrically insulating surface of a substrate;

depositing an organic primer layer in a pattern over the conductive material layer;

depositing an etch-resist material layer over the primer layer, the etch-resist material layer and the primer layer forming a bi-component etch mask in the pattern resulting in covered portions of the conductive material layer and exposed portions of the conductive material layer;

performing a wet-etch process to remove the exposed portions of the conductive material layer from the electrically insulating surface;

protecting a portion of the conductive material layer from being removed during the wet-etch process, the portion being located at a sidewall of the conductive material layer under the bi-component etch mask; and removing the bi-component etch mask to expose conductive material remaining from the covered portions of the conductive material layer, thereby forming the one or more electrically conductive features of the device, wherein the organic material comprises a Schiff Base.

17. A method of making a device comprising one or more electrically conductive features, the method comprising:

depositing an organic material primer layer over a conductive material layer on an electrically insulating surface of a substrate, the organic material primer layer being chosen from a material comprising one or more -azole groups and a material comprising a Schiff Base, depositing an etch-resist material layer over the primer layer, the etch-resist material layer and the primer layer forming a bi-component etch mask resulting in covered portions of the conductive material layer and exposed portions of the conductive material layer;

performing a wet-etch process to remove the exposed portions of the conductive material layer from the electrically insulating substrate; and removing the bi-component etch mask to expose conductive material remaining from the covered portions of the conductive material layer, thereby forming the one or more electrically conductive features of the device.

18. The method of claim 17, further comprising protecting a portion of the conductive material layer from being removed during the wet-etch process, the portion being located at a sidewall of the conductive material layer under the bi-component etch mask.

19. The method of claim 17, further comprising irradiating portions of the etch-resist material layer with light, the irradiated portions corresponding to the one or more electrically conductive features.

20. The method of claim 17, wherein depositing the etch-resist material layer comprises depositing the etch-resist material layer using at least one of inkjet printing, slot die coating, spin coating, or lamination.

21. The method of claim 17, wherein depositing the organic material primer layer comprises depositing the primer layer using at least one of inkjet printing, slot die coating, spin coating, or lamination.

22. The method of claim 17, wherein, in a dried state, a thickness of the primer layer ranges from 0.01 µm to 5 µm.

23. The method of claim 17, wherein the conductive material layer comprises a metal.

24. The method of claim 17, wherein the conductive material layer comprises copper.

* * * * *